United States Patent
Tang et al.

(10) Patent No.: US 12,376,361 B2
(45) Date of Patent: *Jul. 29, 2025

(54) CAPPING LAYERS IN METAL GATES OF TRANSISTORS

(71) Applicant: Taiwan Semiconductor Manufacturing Co., Ltd., Hsinchu (TW)

(72) Inventors: Tsung-Ta Tang, Hsinchu (TW); Yi-Ting Wang, Kaohsiung (TW); Chung Ta Chen, Hsinchu (TW); Hsien-Ming Lee, Changhua (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 19 days.

This patent is subject to a terminal disclaimer.

(21) Appl. No.: 17/655,627

(22) Filed: Mar. 21, 2022

(65) Prior Publication Data

US 2022/0208984 A1    Jun. 30, 2022

Related U.S. Application Data

(63) Continuation of application No. 16/458,679, filed on Jul. 1, 2019, now Pat. No. 11,282,938.

(Continued)

(51) Int. Cl.
*H10D 64/66* (2025.01)
*H01L 21/02* (2006.01)
(Continued)

(52) U.S. Cl.
CPC ..... *H10D 64/667* (2025.01); *H01L 21/02164* (2013.01); *H01L 21/0223* (2013.01);
(Continued)

(58) Field of Classification Search
CPC ........... H01L 21/02164; H01L 21/0223; H01L 21/28088; H01L 21/28556; H01L 21/26513; H01L 21/31053; H01L 21/76224; H01L 29/4966; H01L 29/0847; H01L 29/401; H01L 29/66545;
(Continued)

(56) References Cited

U.S. PATENT DOCUMENTS 9,768,302 B2    9/2017 Sung et al.
9,985,031 B2    5/2018 Chang et al.
(Continued)

FOREIGN PATENT DOCUMENTS

KR    20150071637 A    6/2015
KR    20180015484 A    2/2018
(Continued)

*Primary Examiner* — Shaun M Campbell
(74) *Attorney, Agent, or Firm* — Slater Matsil, LLP

(57) ABSTRACT

A method of forming a semiconductor device includes forming a gate electrode in a wafer. The formation of the gate electrode includes depositing a work-function layer, after the work-function layer is deposited, performing a treatment on the wafer, wherein the treatment is performed by soaking the wafer using a silicon-containing gas; after the treatment, forming a metal capping layer over the work-function layer; and depositing a filling metal over the metal capping layer.

20 Claims, 26 Drawing Sheets

Related U.S. Application Data

(60) Provisional application No. 62/738,452, filed on Sep. 28, 2018.

(51) Int. Cl.
   *H01L 21/28* (2025.01)
   *H01L 21/285* (2006.01)
   *H10D 30/01* (2025.01)
   *H10D 30/62* (2025.01)
   *H10D 62/13* (2025.01)
   *H10D 64/01* (2025.01)
   *H01L 21/265* (2006.01)
   *H01L 21/3105* (2006.01)
   *H01L 21/762* (2006.01)
   *H10D 62/00* (2025.01)
   *H10D 62/17* (2025.01)
   *H10D 62/60* (2025.01)

(52) U.S. Cl.
   CPC .. *H01L 21/28088* (2013.01); *H01L 21/28556* (2013.01); *H10D 30/024* (2025.01); *H10D 30/6211* (2025.01); *H10D 62/151* (2025.01); *H10D 64/01* (2025.01); *H10D 64/017* (2025.01); *H01L 21/26513* (2013.01); *H01L 21/31053* (2013.01); *H01L 21/76224* (2013.01); *H10D 62/021* (2025.01); *H10D 62/393* (2025.01); *H10D 62/60* (2025.01); *H10D 64/021* (2025.01)

(58) Field of Classification Search
   CPC ........... H01L 29/66795; H01L 29/7851; H01L 29/1095; H01L 29/36; H01L 29/6656; H01L 29/66636
   See application file for complete search history.

(56) References Cited

U.S. PATENT DOCUMENTS

| | | | |
|---|---|---|---|
| 10,014,185 B1* | 7/2018 | Wu | H01L 21/02183 |
| 10,276,691 B2 | 4/2019 | Yeong et al. | |
| 10,431,670 B2 | 10/2019 | Tsai et al. | |
| 10,510,762 B2 | 12/2019 | Chiou et al. | |
| 10,804,395 B2 | 10/2020 | Tsai et al. | |
| 10,991,695 B2 | 4/2021 | Chang et al. | |
| 11,282,938 B2* | 3/2022 | Tang | H01L 29/0847 |
| 2014/0273428 A1* | 9/2014 | Shero | H01L 21/3105 438/592 |
| 2015/0171177 A1 | 6/2015 | Cheng et al. | |
| 2015/0318212 A1 | 11/2015 | Tsai et al. | |
| 2017/0110552 A1* | 4/2017 | Lee | H01L 21/28556 |
| 2017/0243958 A1 | 8/2017 | Li | |
| 2018/0040620 A1* | 2/2018 | Ha | H01L 29/7854 |
| 2018/0130905 A1* | 5/2018 | Chung | H01L 21/283 |
| 2018/0254246 A1 | 9/2018 | Park et al. | |
| 2019/0371675 A1 | 12/2019 | Tsai et al. | |
| 2020/0075332 A1* | 3/2020 | Swenberg | H01L 21/67207 |

FOREIGN PATENT DOCUMENTS

| | | |
|---|---|---|
| KR | 20180050817 A | 5/2018 |
| TW | 201608643 A | 3/2016 |
| TW | 201724501 A | 7/2017 |
| TW | 201738961 A | 11/2017 |
| TW | 201739051 A | 11/2017 |
| TW | 201824364 A | 7/2018 |
| TW | 201824394 A | 7/2018 |
| TW | 201824547 A | 7/2018 |

* cited by examiner

CAPPING LAYERS IN METAL GATES OF TRANSISTORS

PRIORITY CLAIM AND CROSS-REFERENCE

This application is a continuation of U.S. application Ser. No. 16/458,679, entitled "Capping Layers in Metal Gates of Transistors," filed Jul. 1, 2019, which claims the benefit of the U.S. Provisional Application No. 62/738,452, filed Sep. 28, 2018, and entitled "Capping Layers in Metal Gates of Transistors," which applications are hereby incorporated herein by reference.

BACKGROUND

Metal-Oxide-Semiconductor (MOS) devices are basic building elements in integrated circuits. An existing MOS device typically has a gate electrode formed of polysilicon doped with p-type or n-type impurities, using doping operations such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to meet the requirements of the NMOS devices and PMOS devices.

The formation of metal gates typically involves depositing metal layers and then performing Chemical Mechanical Polish (CMP) to remove excess portions of the metal layers. The remaining portions of the metal layers form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
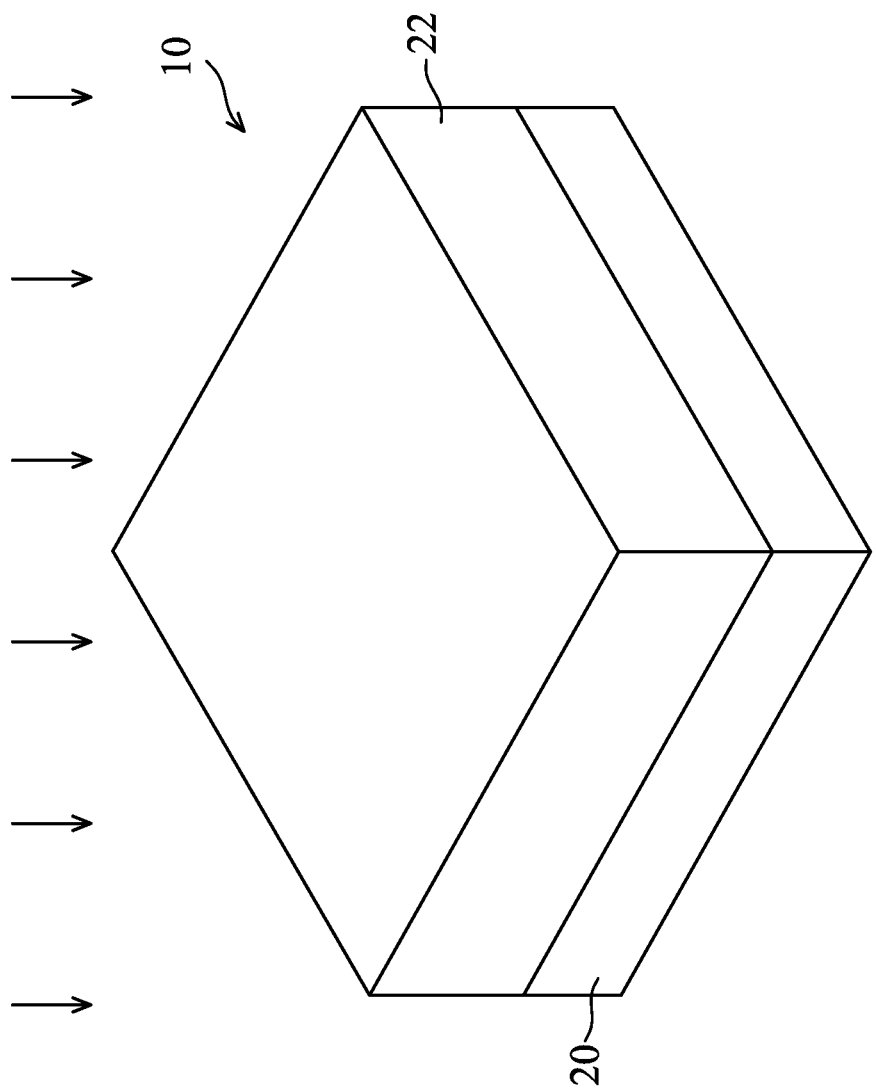
FIGS. 1-6, 7A, 7B, 8, 9A, 9B, 19, and 20 illustrate the perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with replacement gates and the methods of forming the same are provided in accordance with various embodiments. The intermediate stages of forming the transistors are illustrated in accordance with some embodiments. Some variations of some embodiments are discussed. Throughout the various views and illustrative embodiments, like reference numbers are used to designate like elements. In the illustrated embodiments, the formation of Fin Field-Effect Transistors (FinFETs) is used as an example to explain the concept of the present disclosure. Planar transistors may also adopt the concept of the present disclosure. In accordance with some embodiments of the present disclosure, a silicon-containing soaking (treatment) process is performed after the formation of a work-function layer and before the filling metal of the metal gate is deposited. The silicon-containing layer resulted from the silicon-containing soaking process has the function of preventing the metal in the work-function layer from diffusing upwardly to adversely affect the work function, and preventing oxygen from diffusing downwardly into the work-function layer.

Figure 23:
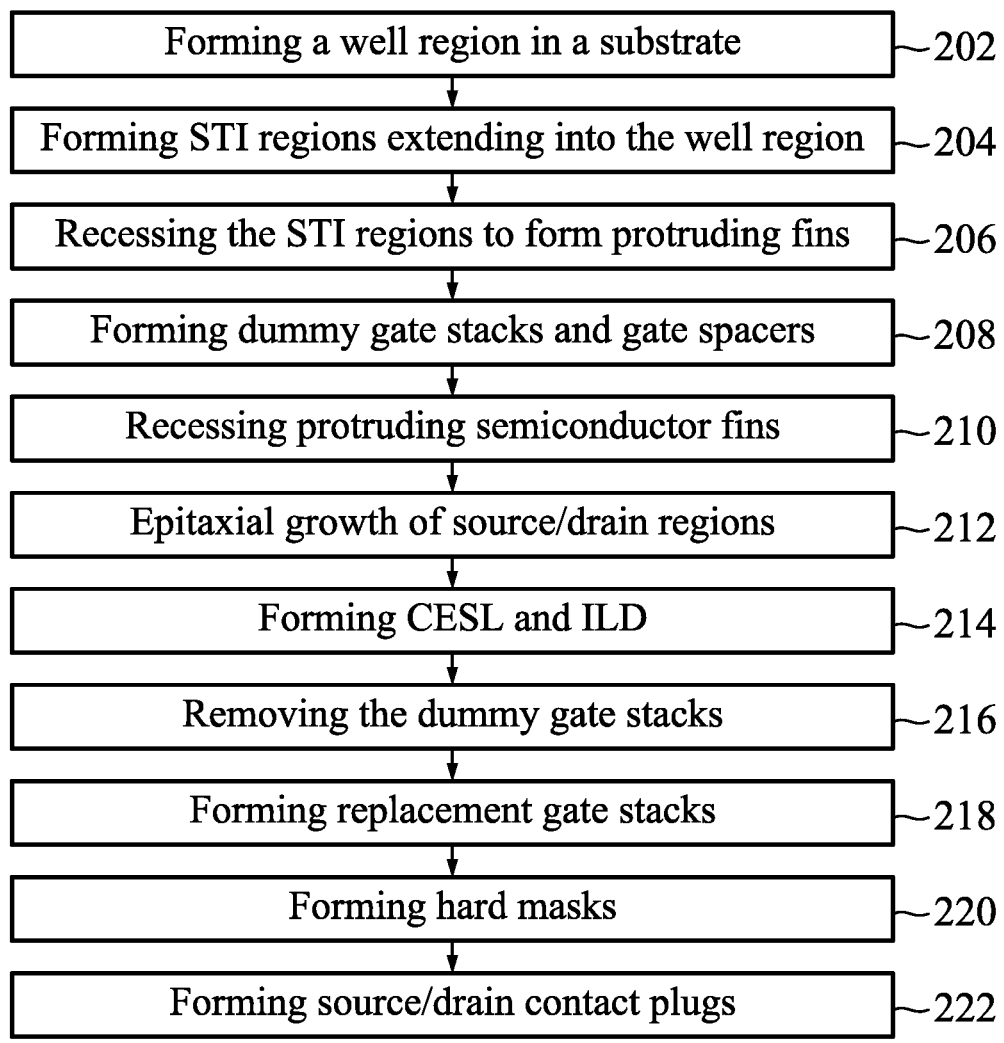
FIG. 23 illustrates a process flow for forming a FinFET in accordance with some embodiments.

FIGS. 1-8, 9A, 9B, 19, and 20 illustrate the cross-sectional views and perspective views of intermediate stages in the formation of a Fin Field-Effect Transistor (FinFET) in accordance with some embodiments of the present disclosure. The processes shown in these figures are also reflected schematically in the process flow 200 shown in FIG. 23.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 shown in FIG. 23. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
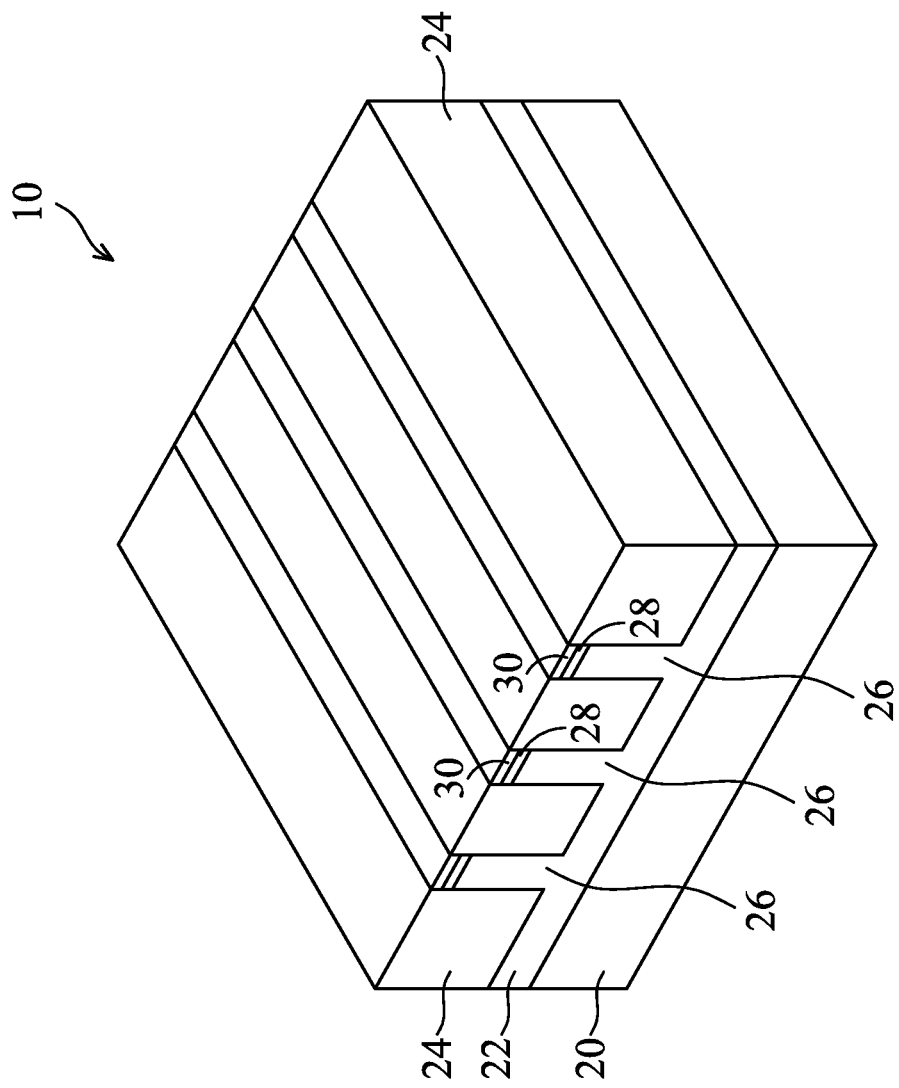

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 shown in FIG. 23. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
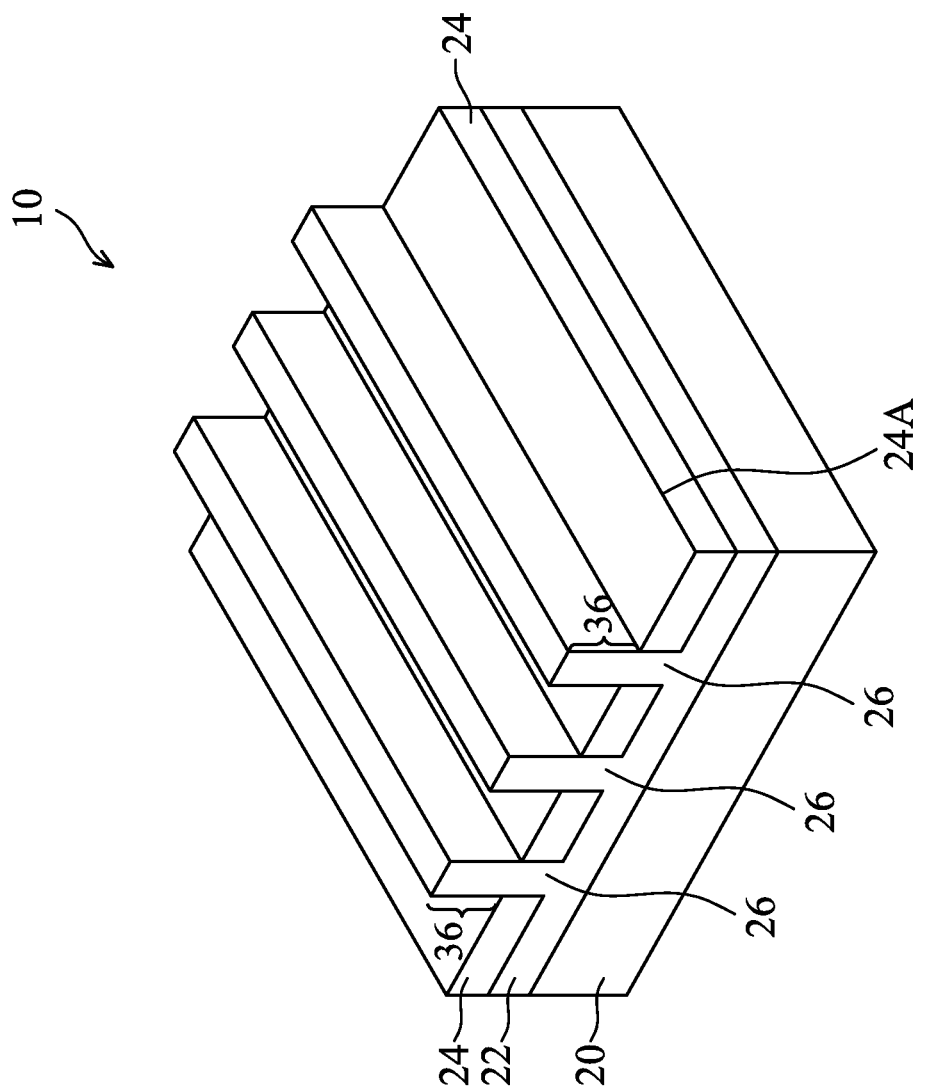

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 206 in the process flow 200 shown in FIG. 23. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
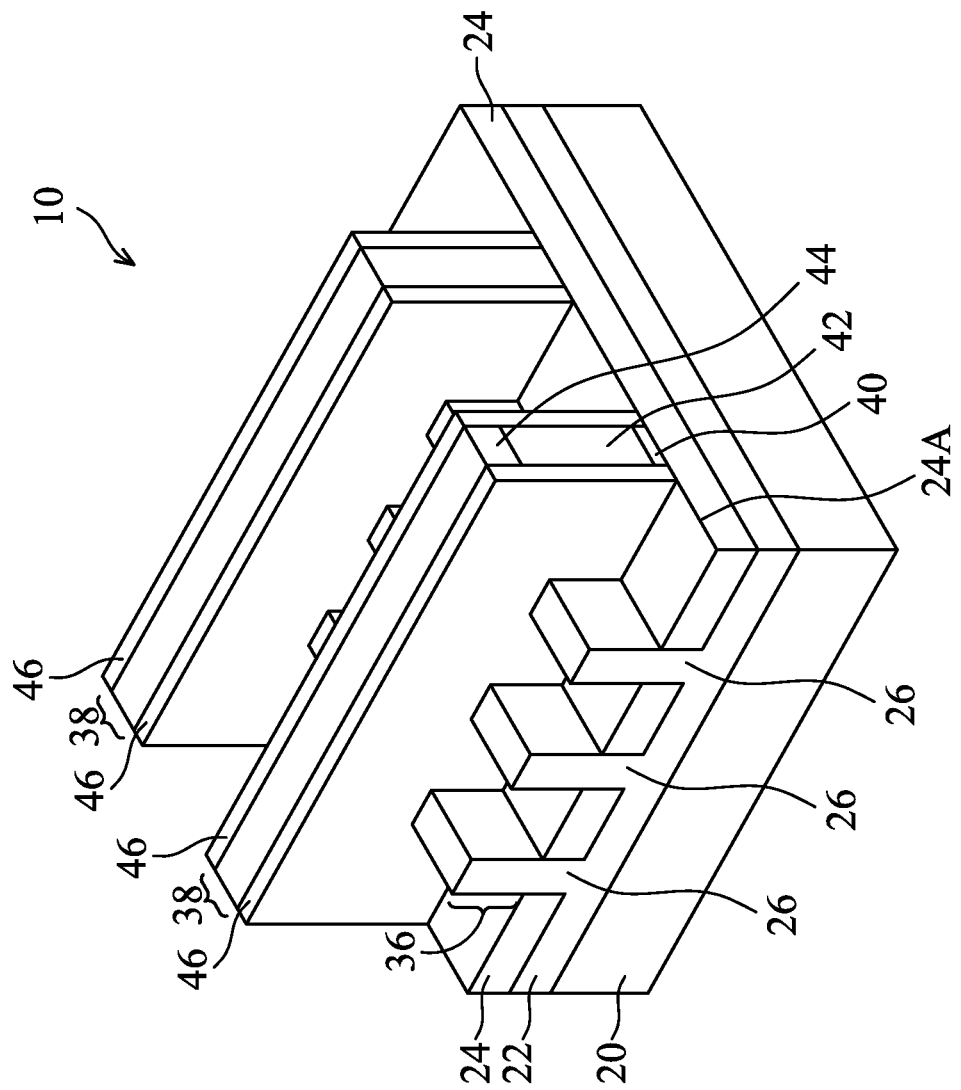

Referring to FIG. 4, dummy gate stacks 38 are formed to extend on the top surfaces and the sidewalls of (protruding) fins 36. The respective process is illustrated as process 208 in the process flow 200 shown in FIG. 23. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 shown in FIG. 23. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
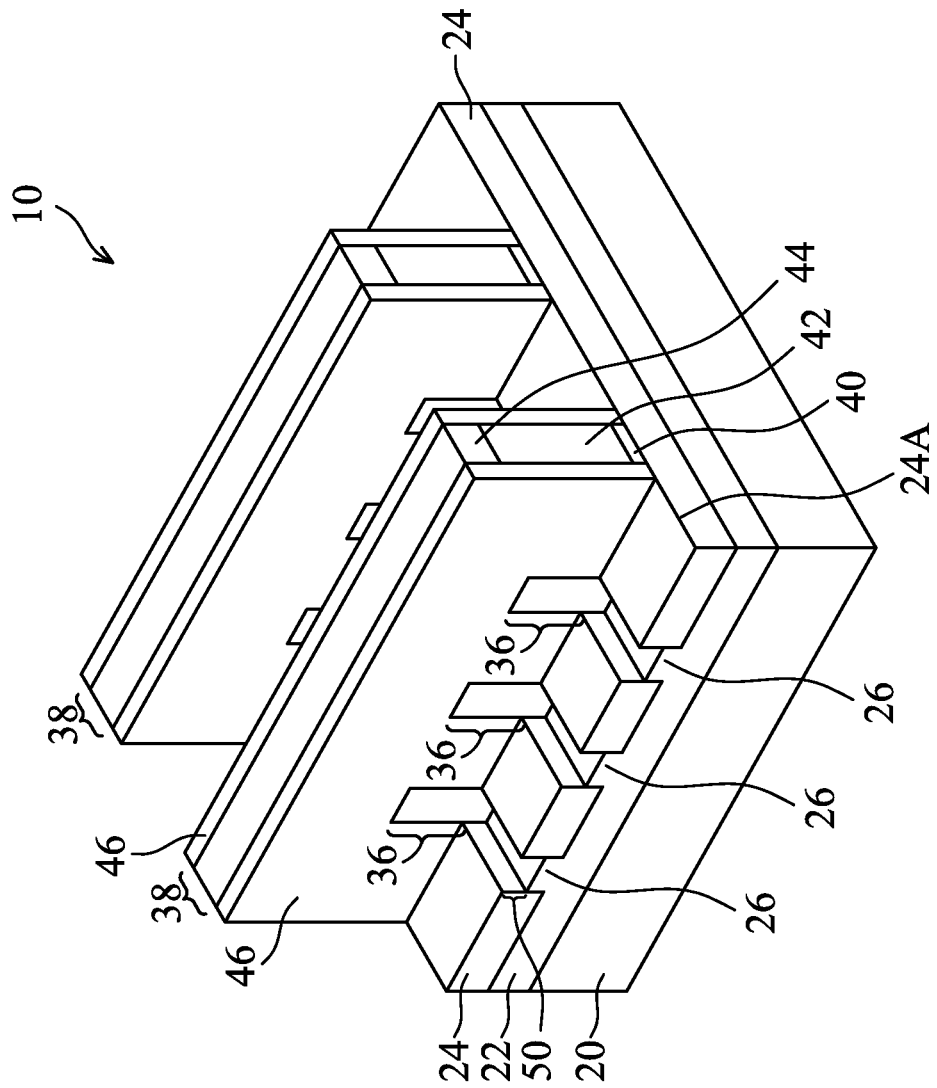

An etching process is then performed to etch the portions of protruding fins 36 that are not covered by dummy gate stacks 38 and gate spacers 46, resulting in the structure shown in FIG. 5. The respective process is illustrated as process 210 in the process flow 200 shown in FIG. 23. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
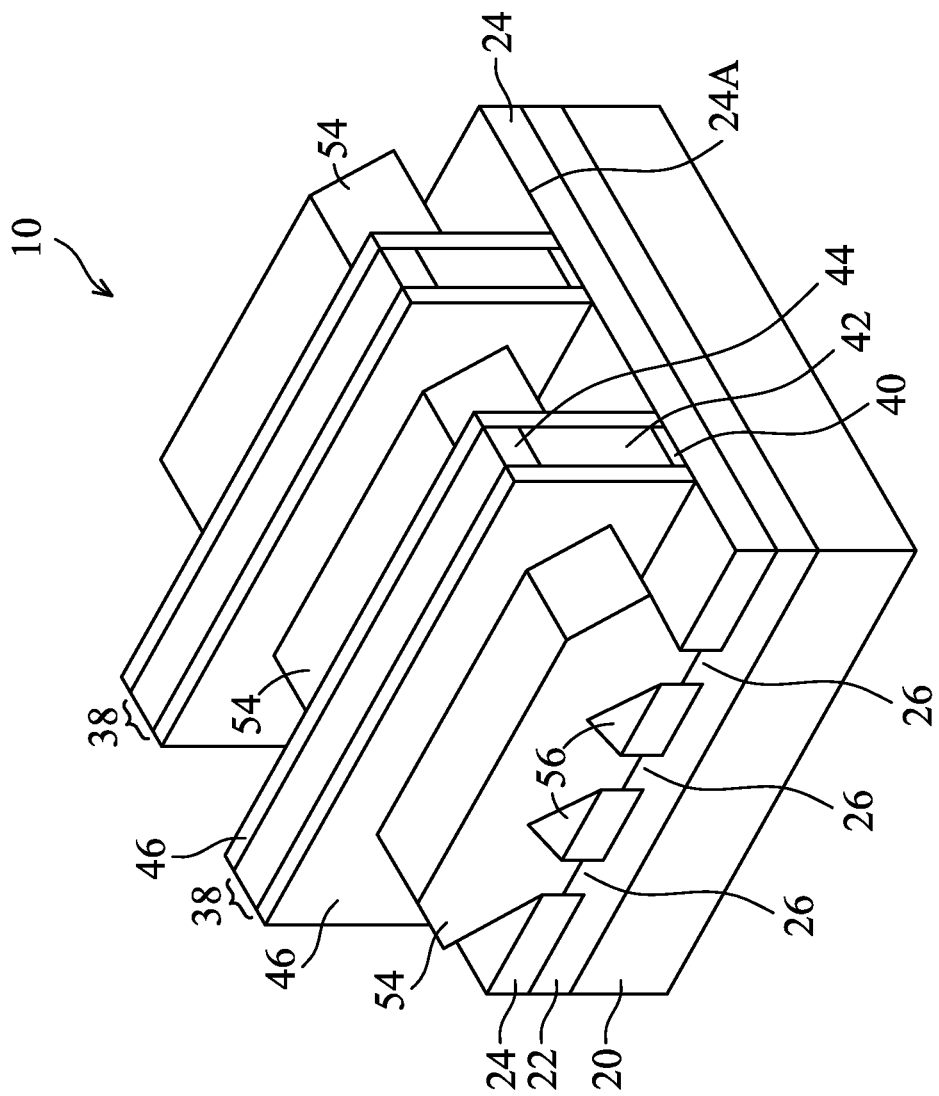

Next, epitaxy regions (source/drain regions) 54 are formed by selectively growing (through epitaxy) a semiconductor material in recesses 50, resulting in the structure in FIG. 6. The respective process is illustrated as process 212 in the process flow 200 shown in FIG. 23. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) or silicon boron (SiB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 6.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
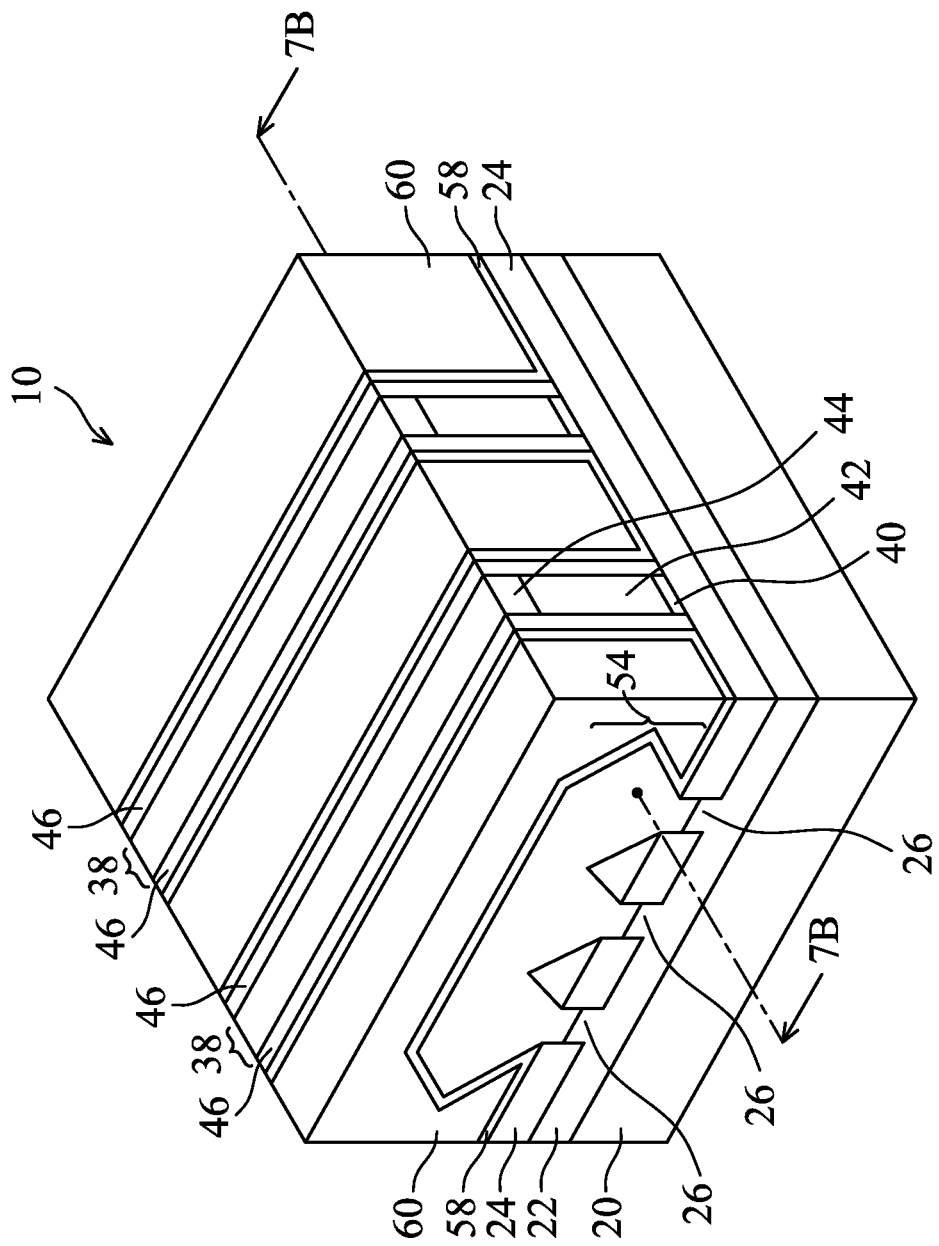

FIG. 7A illustrates a perspective view of the structure after the formation of Contact Etch Stop Layer (CESL) 58 and Inter-Layer Dielectric (ILD) 60. The respective process is illustrated as process 214 in the process flow 200 shown in FIG. 23. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
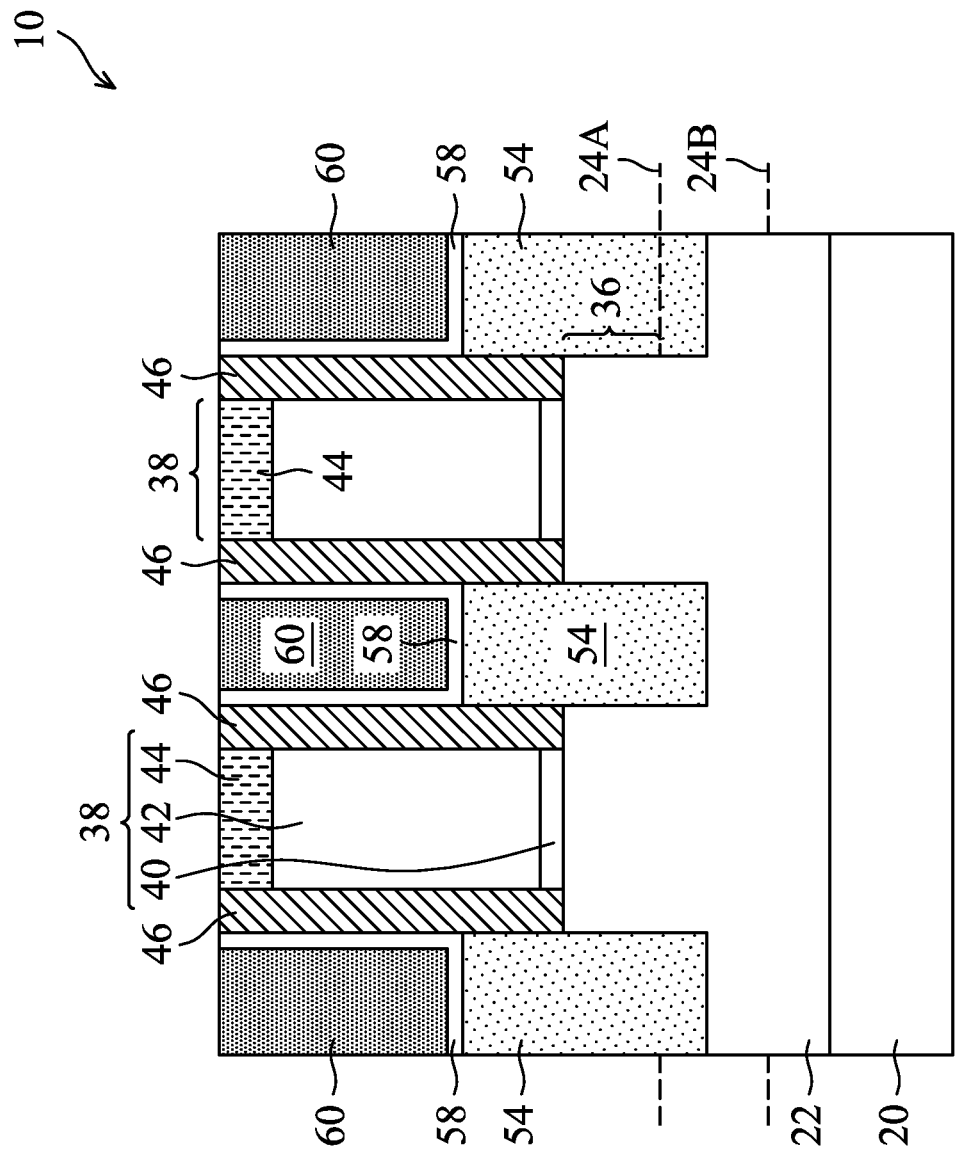
Figure 8:
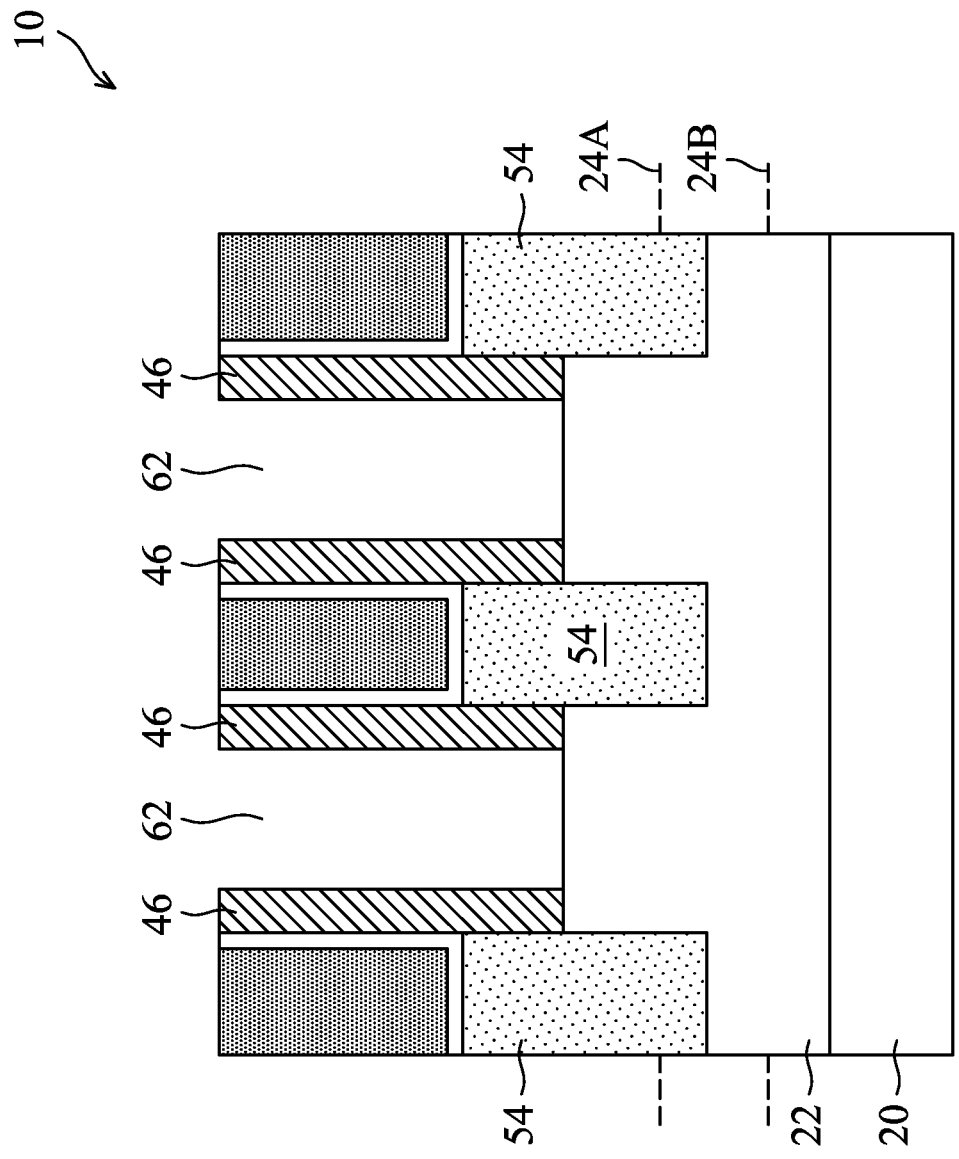
Figure 9A:
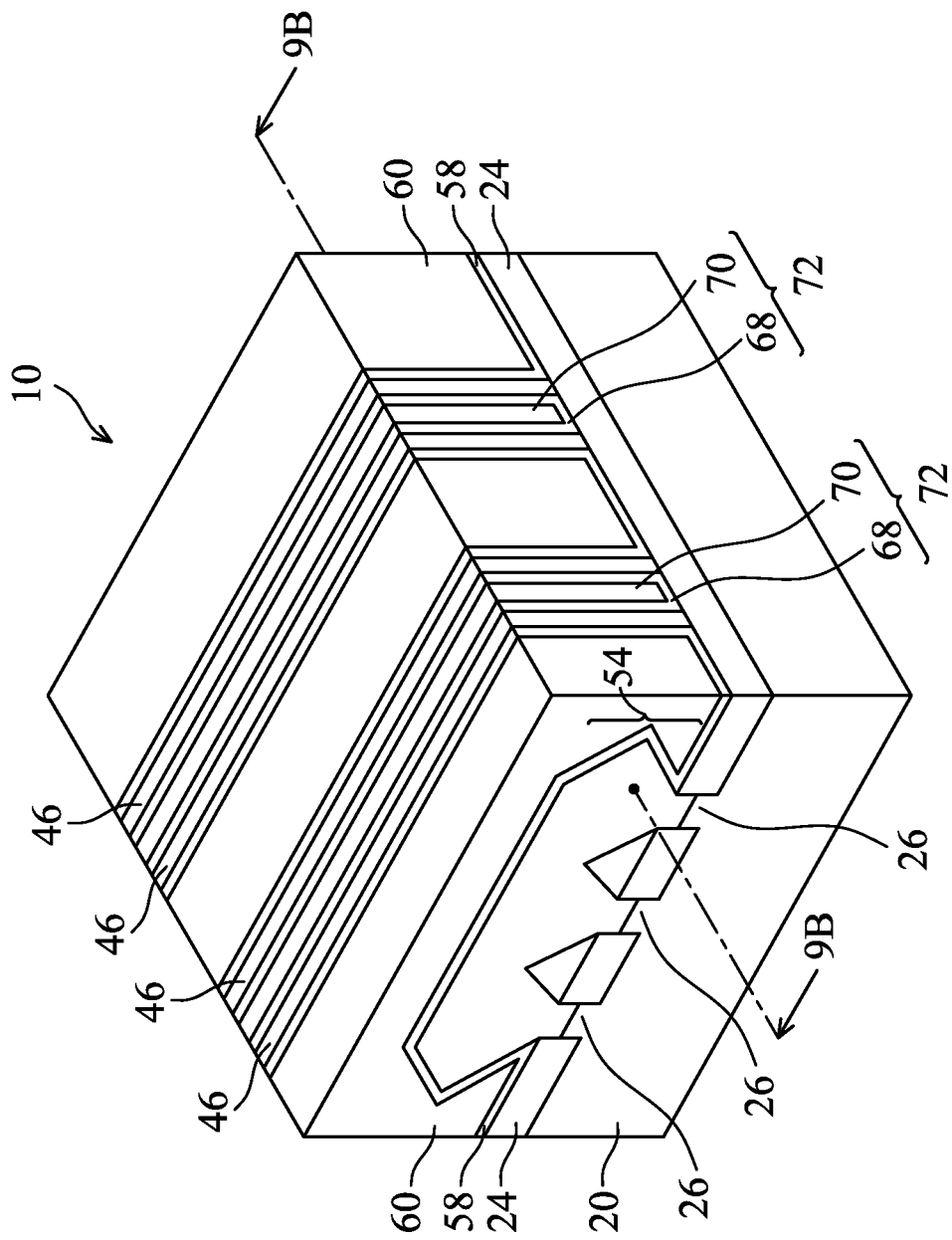
Figure 9B:
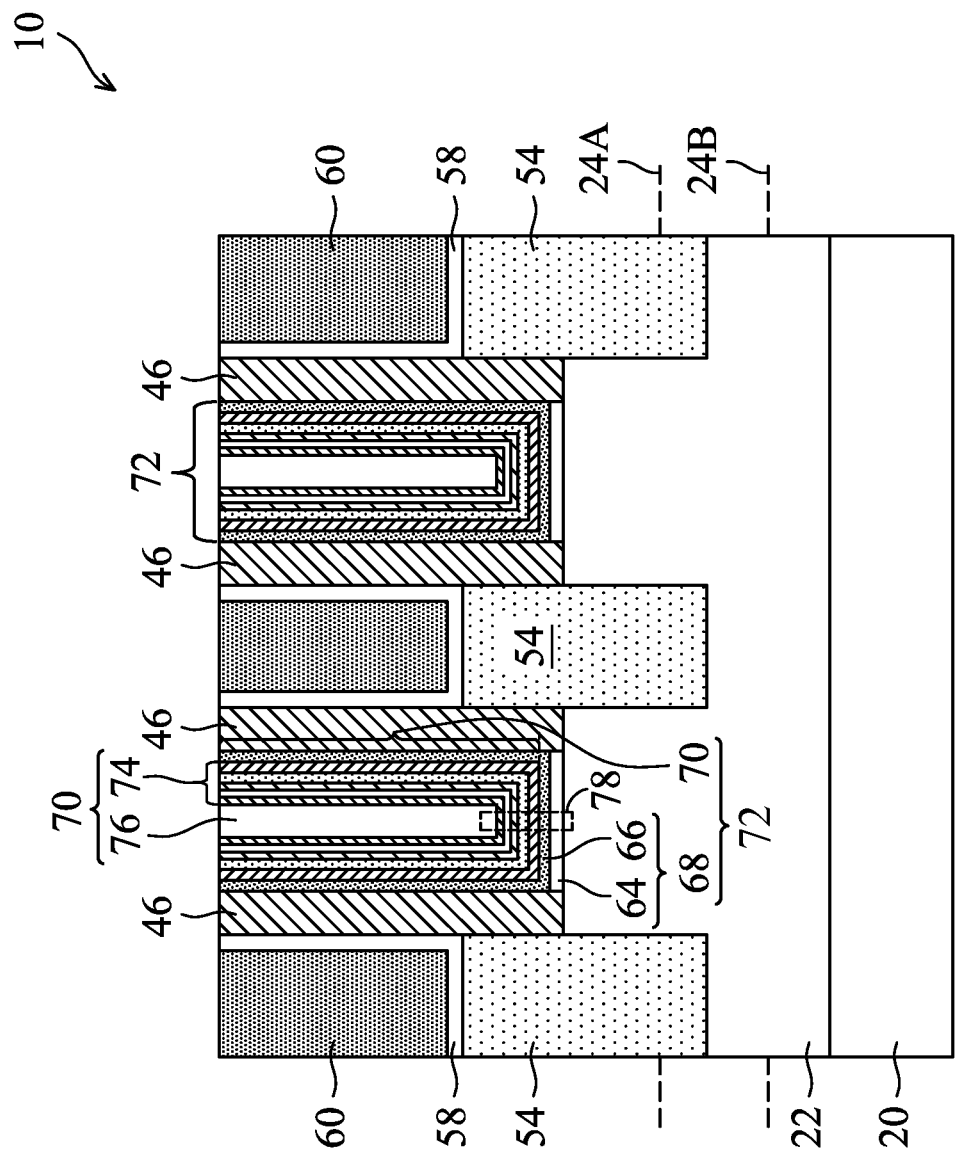

FIG. 7B illustrates the reference cross-section 7B-7B in FIG. 7A, in which dummy gate stacks 38 are illustrated. Next, the dummy gate stacks 38 including hard mask layers 44, dummy gate electrodes 42 and dummy gate dielectrics 40 are etched, forming trenches 62 between gate spacers 46, as shown in FIG. 8. The respective process is illustrated as process 216 in the process flow 200 shown in FIG. 23. The top surfaces and the sidewalls of protruding fins 36 are exposed to trenches 62. Next, as shown in FIGS. 9A and 9B, replacement gate stacks 72 are formed in trenches 62 (FIG. 8). FIG. 9B illustrates the reference cross-section 9B-9B in FIG. 9A. The respective process is illustrated as process 218 in the process flow 200 shown in FIG. 23. Replacement gate stacks 72 include gate dielectrics 68 and the corresponding gate electrodes 70.

In accordance with some embodiments of the present disclosure, a gate dielectric 68 includes Interfacial Layer (IL) 64 as its lower part. IL 64 is formed on the exposed surfaces of protruding fins 36. IL 64 may include an oxide layer such as a silicon oxide layer, which is formed through the thermal oxidation of protruding fins 36, a chemical oxidation process, or a deposition process. Gate dielectric 68 may also include high-k dielectric layer 66 formed over IL 64. High-k dielectric layer 66 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layer 66 is overlying, and may contact, IL 64. High-k dielectric layer 66 is formed as a conformal layer, and extends on the sidewalls of protruding fins 36 and the top surface and the sidewalls of gate spacers 46. In accordance with some embodiments of the present disclosure, high-k dielectric layer 66 is formed using ALD, CVD, PECVD, Molecular-Beam Deposition (MBD), or the like.

Further referring to FIG. 9B, gate electrode 70 is formed on gate dielectric 68. Gate electrode 70 may include a plurality of metal-containing layers 74, which may be formed as conformal layers, and a filling-metal region 76 filling the rest of the trenches unfilled by the plurality of metal-containing layers 74. Metal-containing layers 74 may include a barrier layer, a work-function layer over the barrier layer, and one or a plurality of metal capping layers over the work-function layer. The detailed structure of the metal-containing layers 74 is discussed referring to FIGS. 10 through 18.

Figure 24:
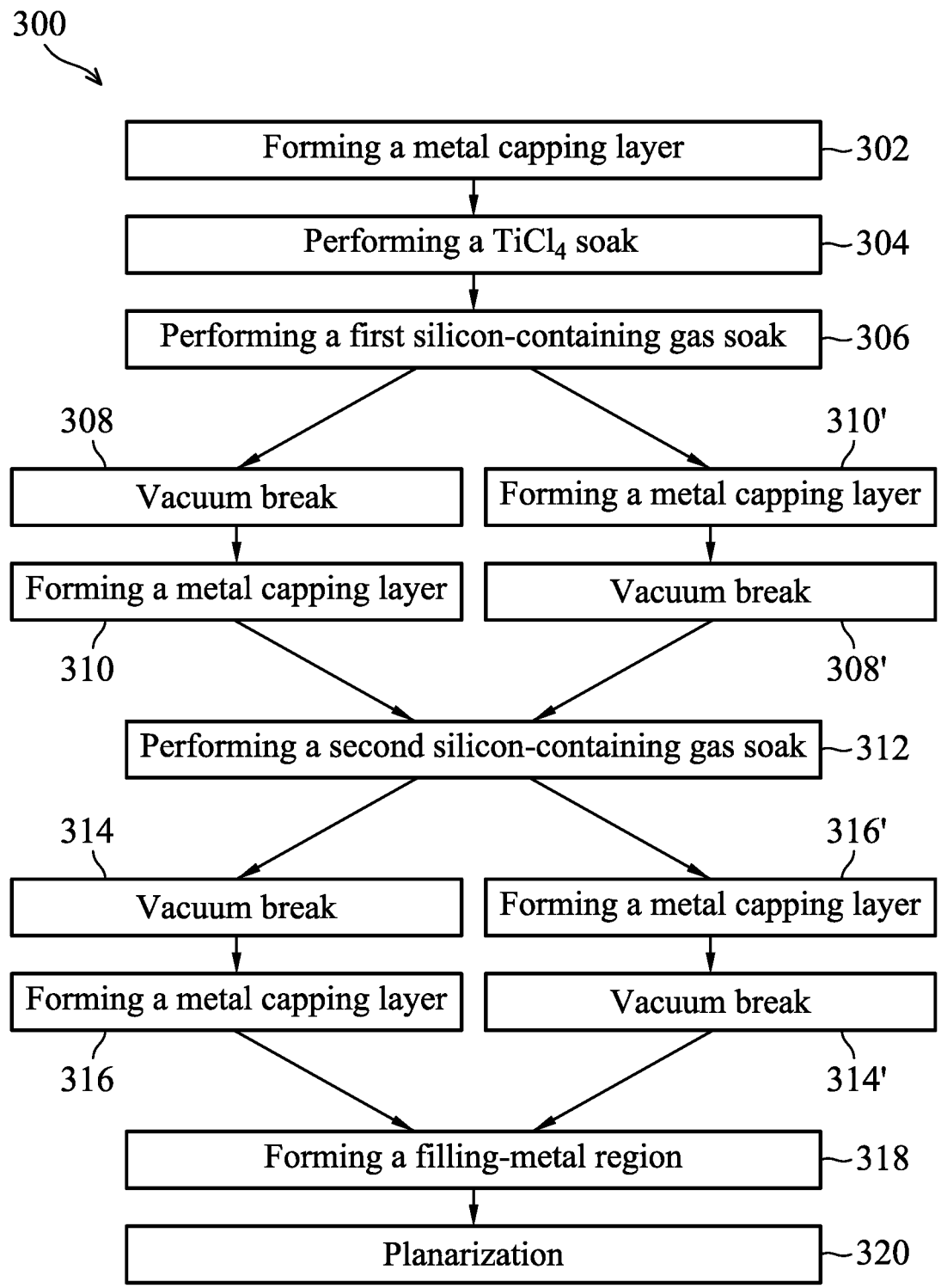
FIG. 24 illustrates a process flow for forming a gate stack in accordance with some embodiments.

FIG. 9B schematically illustrates region 78, in which a portion of fin 36, a portion of gate dielectric 68, a portion of metal-containing layers 74, and a portion of filling-metal region 76 are included. FIGS. 10 through 17 illustrate the formation of the features that extend into region 78 in accordance with some embodiments. The respective process flow is illustrated as process flow 300 as shown in FIG. 24.

Figure 15:
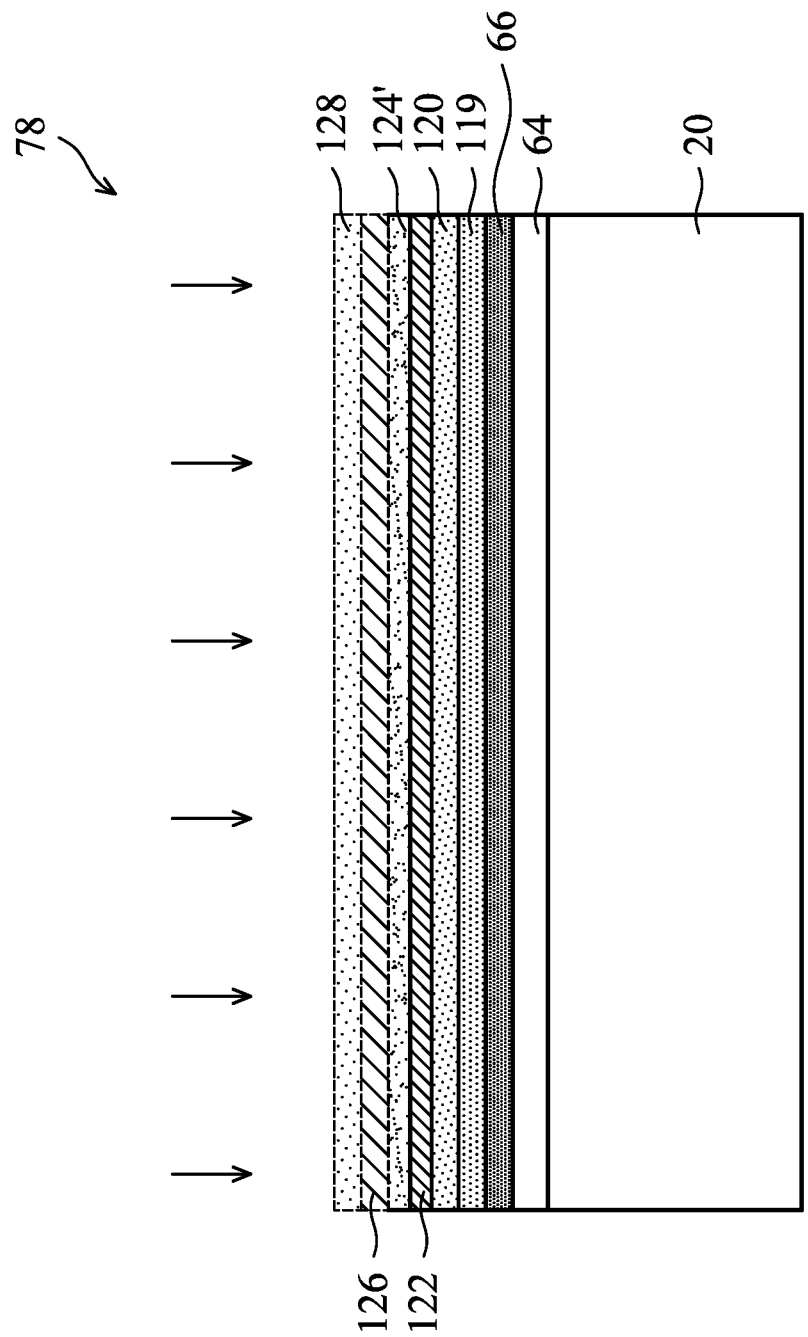
Figure 16:
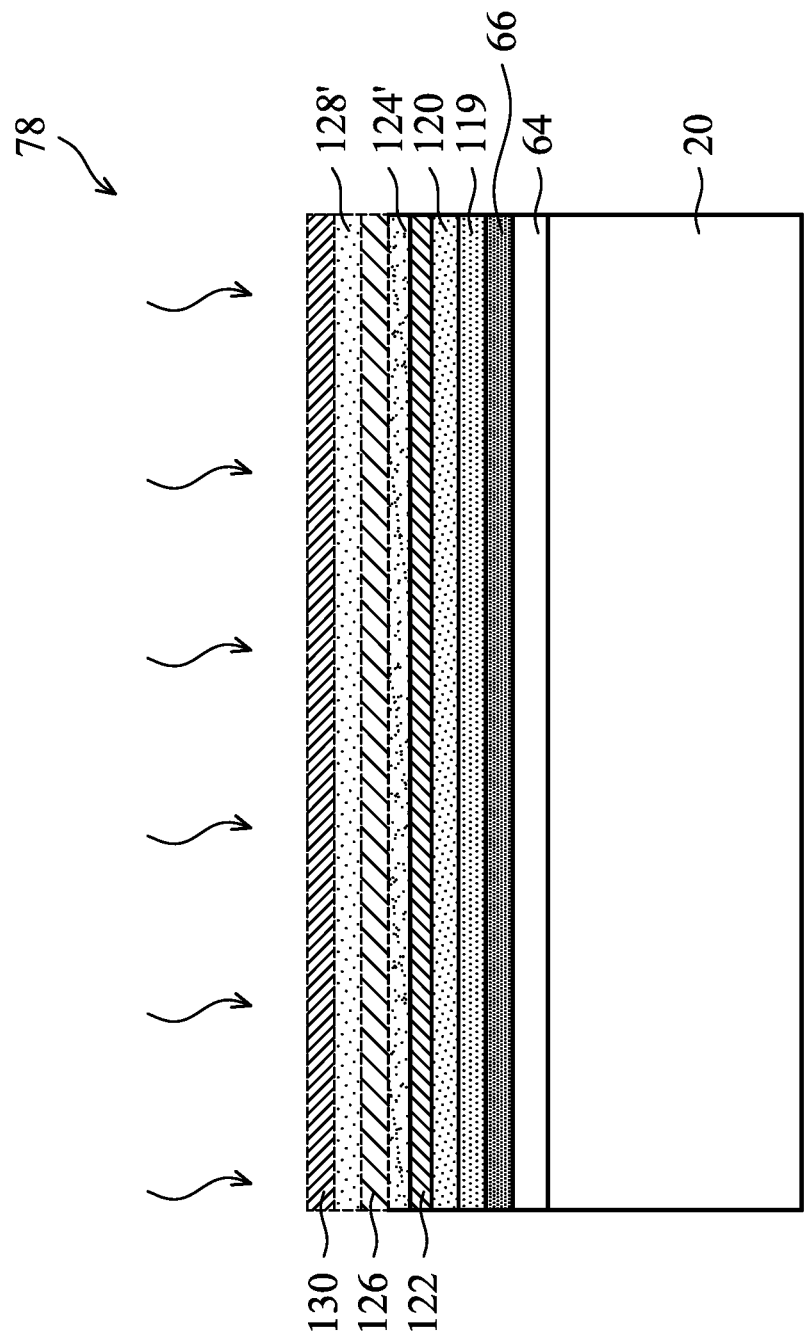
Figure 17:
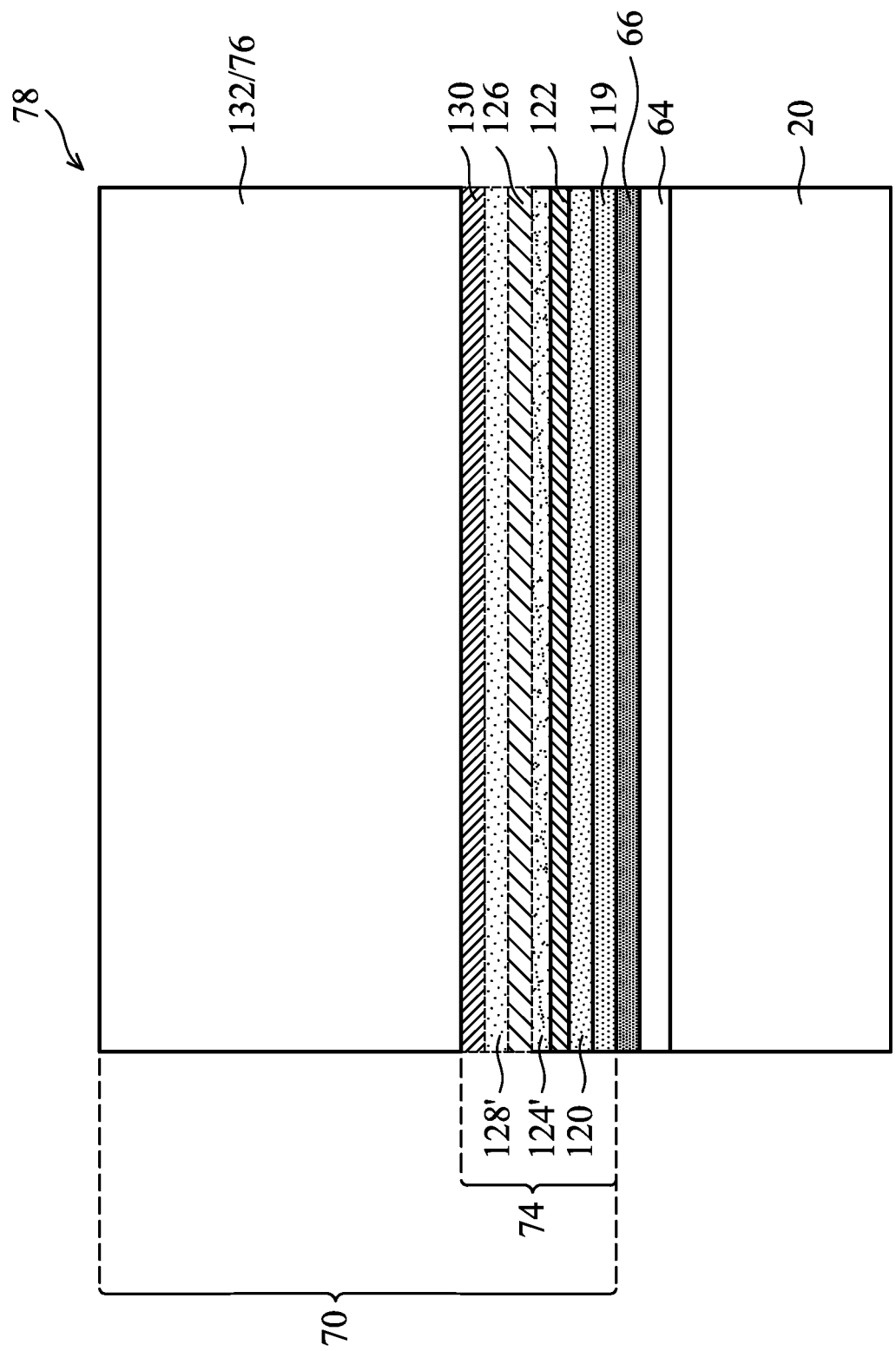

It is appreciated that the processes as shown in FIGS. 10 through 17 include the possible processes that may be implemented in the formation of gate stacks. In accordance with some embodiments of the present disclosure, some, but not all of these processes are performed, and the resulting structure include some, but not all, of the illustrated features as shown in FIG. 17. The possible combinations will be discussed. When a process is not formed, a respective overlying layer that is directly over the skipped process/layer will be in contact with a respective underlying layer that is directly underlying the skipped process/layer.

Figure 10:
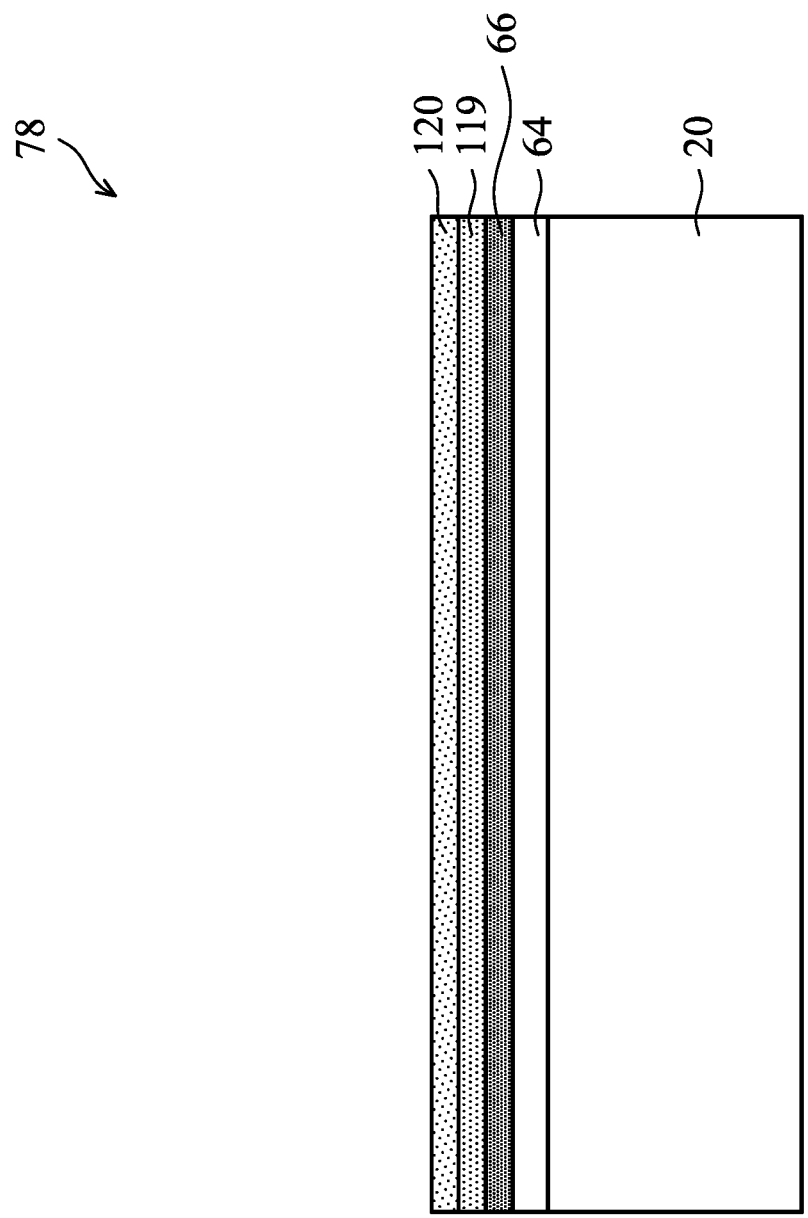
FIGS. 10-18 illustrate the perspective views and cross-sectional views of intermediate stages in the formation of a gate stack of a transistor in accordance with some embodiments.

Referring to FIG. 10, IL 64 is formed on protruding fin 36. High-k dielectric layer 66 is formed over IL 64. In accordance some embodiments, adhesion layer (which is also a diffusion barrier layer) 119 is formed over high-k dielectric layer 66. Adhesion layer 119 may be formed of TiN or Titanium Silicon Nitride (TSN). The TiN layer may be formed using ALD or CVD, and the TSN layer may include alternatingly deposited TiN layers and SiN layers, which are formed using ALD, for example. Since the TiN layers and SiN layers are very thin, these layers may not be able to be distinguished from each other, and are hence referred to as a TSN layer.

Work-function layer 120 is formed over adhesion layer 119. The work-function layer 120 determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, work-function layer 120 may include a TaN layer and a titanium aluminum (TiAl) layer over the TaN layer. When the FinFET is a p-type FinFET, work-function layer 120 may include a TaN layer, a TiN layer over the TaN layer, and a TiAl layer over the TiN layer. It is appreciated that the work-function layers may include different materials, which are also contemplated.

Figure 11:
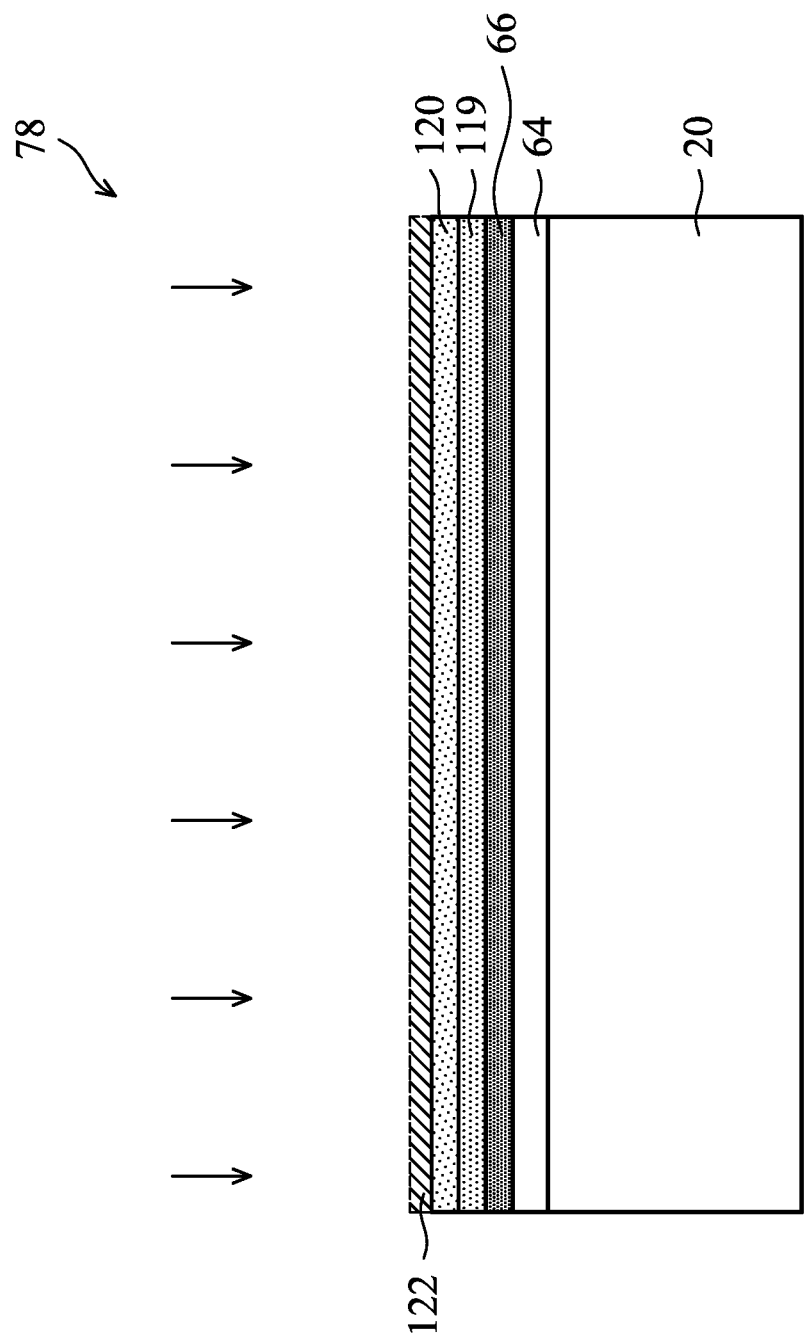
Figure 12:
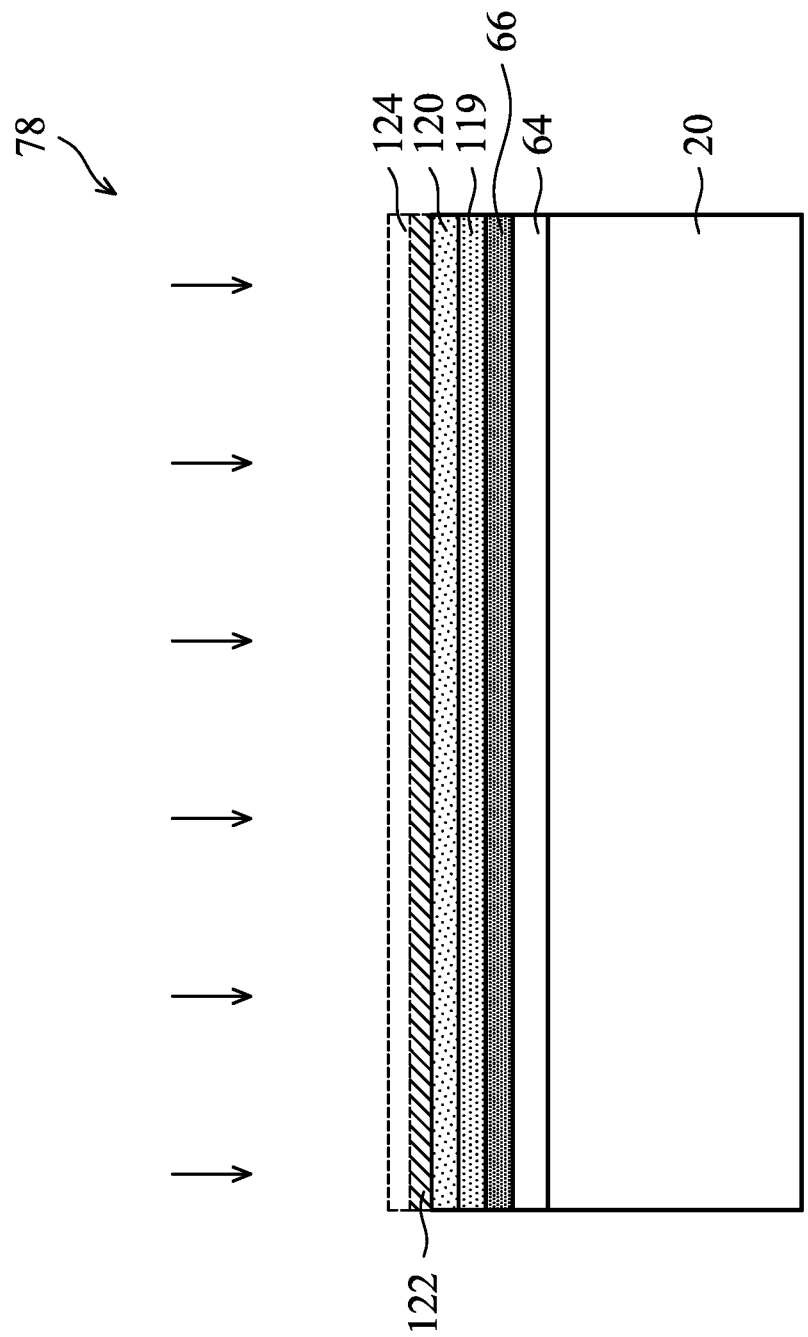

In accordance with some embodiments of the present disclosure, a metal capping layer 122 is formed over work-function layer 120, as shown in FIG. 11. The respective process is illustrated as process 302 in the process flow 300 shown in FIG. 24. Metal capping layer 122 may be formed of a metal nitride such as TiN in accordance with some embodiments, and other materials such as TaN may be used. In accordance with other embodiments, metal capping layer 122 includes the metal nitride, and is free from the TaN. In accordance with some embodiments, metal capping layer 122 is formed using ALD. The thickness of metal capping layer 122 may be in the range between about 5 Å and about 60 Å. In accordance with alternative embodiments, the formation of metal capping layer 122 is skipped, and the soaking steps as shown in FIGS. 11 and 12 may be performed directly on work-function layer 120. Accordingly, metal capping layer 122 is illustrated using dashed lines to indicate that it may or may not be formed.

FIG. 11 illustrates a metal-or-chlorine-containing gas soaking process using a gaseous precursor. In accordance with some embodiments, the precursor includes a titanium-containing gas and/or a chlorine-based gas. For example, the precursor may include $TiCl_4$ as a process gas. When the $TiCl_4$ is used, the corresponding soaking process may also be referred to as a $TiCl_4$ soaking process. The respective process is illustrated as process 304 in the process flow 300 shown in FIG. 24. This process is beneficial when metal capping layer 122 is not formed, and the metal-or-chlorine-containing gas soaking is performed on work-function layer 120, which is exposed to $TiCl_4$. In accordance with some embodiments, $TiCl_4$, which is a gas, is provided to soak wafer 10, in which either work-function layer 120 or metal capping layer 122 is exposed. During the metal-or-chlorine-containing gas soaking, wafer 10 is heated, for example, to a temperature in the range between about 200° C. and about 500° C. No plasma is generated. The soaking duration may be greater than about 5 seconds. The $TiCl_4$ soaking results in the resulting molecules (such as $TiCl_3$ molecules) to be connected to the dangling bonds of the underlying work-function layer 120. In accordance with some embodiments in which metal capping layer 122 is formed, the metal-or-chlorine-containing gas soaking process may be performed or skipped. The metal-or-chlorine-containing gas soaking process is used to improve the bonding of silicon to the underlying work-function layer 120 since the silicon-containing gas as provided in the subsequent silicon-containing gas soaking does not have good adhesion to work-function layer 120. As a comparison, with the $TiCl_4$ soaking, Ti-and-Cl containing molecules are attached to work-function layer 120, and the subsequently applied silicon-containing molecules has good bonding to the Ti atoms in $TiCl_4$. Accordingly, when the subsequently discussed silicon-containing gas treatment is performed on work-function layer 120, the $TiCl_4$ is used to improve the bonding of the silicon-containing molecules to work-function layer 120.

In accordance with some embodiments in which the formation of metal capping layer 122 is skipped, the precursor used for the soaking process, instead of being used after the formation of the work-function layer 120, may be conducted simultaneously when work-function layer 120 is formed.

FIG. 12 illustrates a thermal soaking process using a silicon-containing gas, which may be $SiH_4$, $Si_2H_6$, or the like, or combinations thereof. The respective process is illustrated as process 306 in the process flow 300 shown in FIG. 24. During the silicon-containing gas soaking, wafer 10 is heated, for example, to a temperature in the range between about 200° C. and about 550° C. if $SiH_4$ is used, and to a temperature in the range between about 200° C. and about 500° C. if $Si_2H_6$ is used. No plasma is generated. The soaking duration may be in the range between about 30 seconds and about 600 seconds. In the embodiments in which the metal-or-chlorine-containing gas soaking process is performed using $TiCl_4$ as a process gas, there may be a thin silicon-and-titanium rich layer formed at the illustrated surface in FIG. 12. If the metal-or-chlorine-containing gas soaking is not performed, the Si atoms are attached to work-function layers 120 or metal capping layer 122.

FIG. 12 schematically illustrates silicon-containing layer 124 to represent the attached silicon-containing molecules, which include silicon and hydrogen atoms, and possible titanium and chlorine atoms if the $TiCl_4$ soaking was performed.

The formation of work-function layer 120, the formation of metal capping layer 122, the metal-or-chlorine-containing gas soaking process, and the silicon-containing gas soaking process are in-situ performed, so that no vacuum break occurs between these processes. These processes may be performed in different process chambers that are in a same platform, which has a same vacuum environment.

Figure 13:
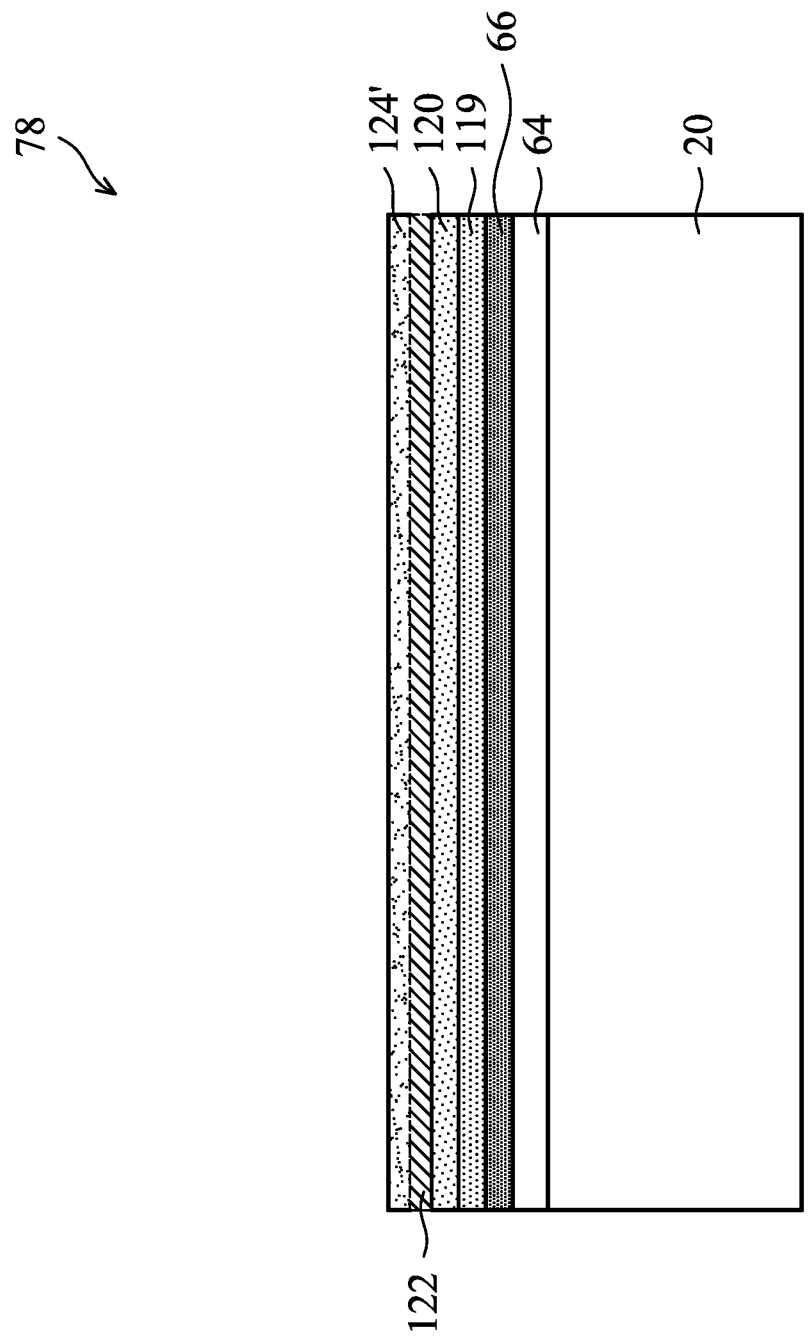

Referring to FIG. 13, after the silicon-containing gas soaking, a vacuum break may be performed. The respective process is illustrated as process 308 in the process flow 300 shown in FIG. 24. As a result of the silicon-containing layer 124 being exposed to air, silicon-containing layer 124 is oxidized to form a silicon oxide layer 124', as shown in FIG. 13. It is appreciated that in subsequent thermal processes, the elements in neighboring layers may diffuse into silicon oxide layer 124'. Accordingly, although layer 124' is referred to as a silicon oxide layer, it is actually a silicon-and-oxygen rich layer comprising other elements, and its silicon and oxygen atomic percentages may be higher than the corresponding silicon and oxygen atomic percentages in the neighboring layer that initially free from silicon and/or oxygen.

Figure 14:
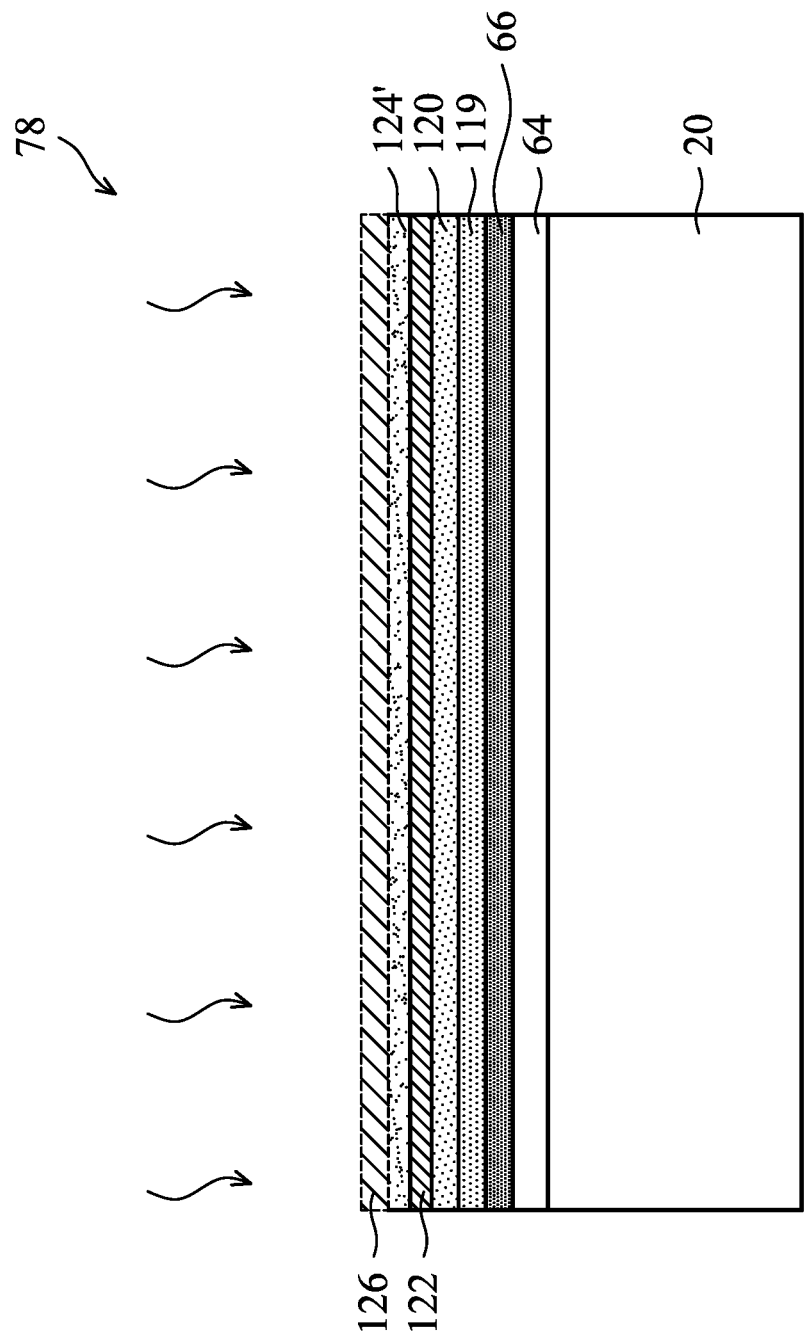

FIG. 14 illustrates the formation of metal capping layer 126. The respective process is illustrated as process 310 in the process flow 300 shown in FIG. 24. The formation method, material, thickness, etc. of metal capping layer 126 may be selected from the candidate methods, candidate materials, candidate thicknesses, of metal capping layer 122. The details are thus not repeated.

In accordance with alternative embodiments, instead of performing vacuum break after the silicon-containing gas soaking and before the formation of the metal capping layer 126, the vacuum break may be performed after the formation of metal capping layer 126, which is over and contacting silicon-containing layer 124. The respective processes are shown as processes 310' and 308'. Since metal capping layer 126 is very thin, for example, in the range between about 5 Å and 60 Å, oxygen penetrates through metal capping layer 126, and silicon-containing layer 124 is oxidized to form silicon oxide layer 124'.

FIG. 15 illustrates the optional second silicon-containing gas soaking process. The respective process is illustrated as process 312 in the process flow 300 shown in FIG. 24. The second silicon-containing gas soaking process may be performed using similar process conditions as that of the first silicon-containing gas soaking process discussed referring to FIG. 12. Accordingly, a silicon-containing layer 128 is formed to terminate the dangling bonds of metal capping layer 126. The second $SiH_4$ soaking process is performed in a vacuum chamber. In accordance with some embodiments of the present disclosure, a vacuum break is performed after the second silicon-containing gas soaking process (and before the formation of metal capping layer 130) to convert silicon-containing layer 128 into a silicon oxide layer (128' as shown in FIG. 16). The respective process is illustrated as process 314 in the process flow 300 shown in FIG. 24.

FIG. 16 illustrates the optional formation of metal capping layer 130. The respective process is illustrated as process 316 in the process flow 300 shown in FIG. 24. The formation method, material, thickness, etc. of metal capping layer 130 may be selected from the candidate methods, candidate materials, candidate thicknesses, and the like for forming metal capping layer 122. The details are thus not repeated. In accordance with some embodiments, instead of performing vacuum break after the silicon-containing gas soaking process (FIG. 16) and before the formation of metal capping layer 130, the vacuum break may be performed after the formation of metal capping layer 130. The respective processes are shown as processes 316' and 314' in the process flow 300 shown in FIG. 24. As a result of the vacuum break, oxygen penetrates through metal capping layer 130 to convert silicon-containing layer 128 (FIG. 15) into silicon oxide layer 128' (FIG. 16). Silicon oxide layer 128' and metal capping layer 130 are illustrated using dashed lines to indicate that these layers may be, or may not be, formed. Layers 119, 120, 122, 124', 126, 128', and 130 in combination correspond to the stacked layers 74 in FIG. 9B.

FIG. 17 illustrates the formation of filling-metal region 132, which corresponds to filling-metal region 76 in FIG. 9B. The respective process is illustrated as process 318 in the process flow 300 shown in FIG. 24. In accordance with some embodiments, filling-metal region 132 is formed of tungsten or cobalt, which may be formed using ALD, CVD, or the like. In accordance with some embodiments, $WF_6$ and $SiH_4$ are used as process gases for depositing tungsten. After the formation of filling-metal region 132, a planarization process may be performed to remove excess portions of the deposited layers as shown in FIG. 17, resulting in the gate stacks 72 as shown in FIGS. 9A and 9B. The respective planarization process is illustrated as process 320 in the process flow 300 shown in FIG. 24. Throughout the discussion, the layers between work-function layer 120 and filling-metal region 132, which may include layers 122, 124', 126, 128', and 130, are collectively referred to as a composite blocking layer.

FIGS. 1 through 17 illustrate a plurality of possibly processes, with some of the processes being optional in some embodiments. Accordingly, a plurality of processes may be selected to form these candidate processes in order to implement a plurality of process flows. As a result, a plurality of gate stacks with different combinations of layers may be formed. Some of the possible processes are discussed below.

In a first candidate process, the process sequence includes forming metal capping layer 122 on work-function layer 120, performing a silicon-containing gas soaking process (with silicon-containing layer 124 formed), forming metal capping layer 126, performing vacuum break, and forming filling-metal region 132. The respective gate stack may include work-function layer 120, metal capping layer 122, silicon oxide layer 124', metal capping layer 126, and filling-metal region 132.

In a second candidate process, the process sequence include forming metal capping layer 122 on work-function layer 120, performing a silicon-containing gas soaking process (with silicon-containing layer 124 formed), performing vacuum break, forming metal capping layer 126, and forming filling-metal region 132. The respective gate stack is the same as the gate stack formed by the first candidate process, and also includes work-function layer 120, metal capping layer 122, silicon oxide layer 124', metal capping layer 126, and filling-metal region 132.

In a third candidate process, the process sequence includes performing a metal-or-chlorine-containing gas soaking process on work-function layer 120, performing a silicon-containing gas soaking process (with silicon-containing layer 124 formed), performing vacuum break, forming metal capping layer 126, and forming filling-metal region 132. The respective gate stack may include work-function layer 120, silicon oxide layer 124' (with Ti and Cl atoms therein), metal capping layer 126, and filling-metal region 132.

In a fourth candidate process, the process sequence include performing a metal-or-chlorine-containing gas soaking process on work-function layer 120, performing a silicon-containing gas soaking process (with silicon-containing layer 124 formed), forming metal capping layer 126, performing vacuum break, and forming filling-metal region 132. The respective gate stack is the same as the gate stack formed by the third candidate process, and also includes work-function layer 120, silicon oxide layer 124' (with Ti and Cl atoms therein), metal capping layer 126, and filling-metal region 132.

In a fifth candidate process, the process sequence include performing a metal-or-chlorine-containing gas soaking process on work-function layer 120, performing a silicon-containing gas soaking process, forming metal capping layer 126, performing vacuum break, performing an additional silicon-containing gas soaking process (with silicon-containing layer 128 formed), forming metal capping layer 130, performing vacuum break, and forming filling-metal region 132. The respective gate stack may include work-function layer 120, silicon oxide layer 124' (with Ti and Cl atoms therein), metal capping layer 126, silicon oxide layer 128', metal capping layer 130, and filling-metal region 132.

Figure 18:
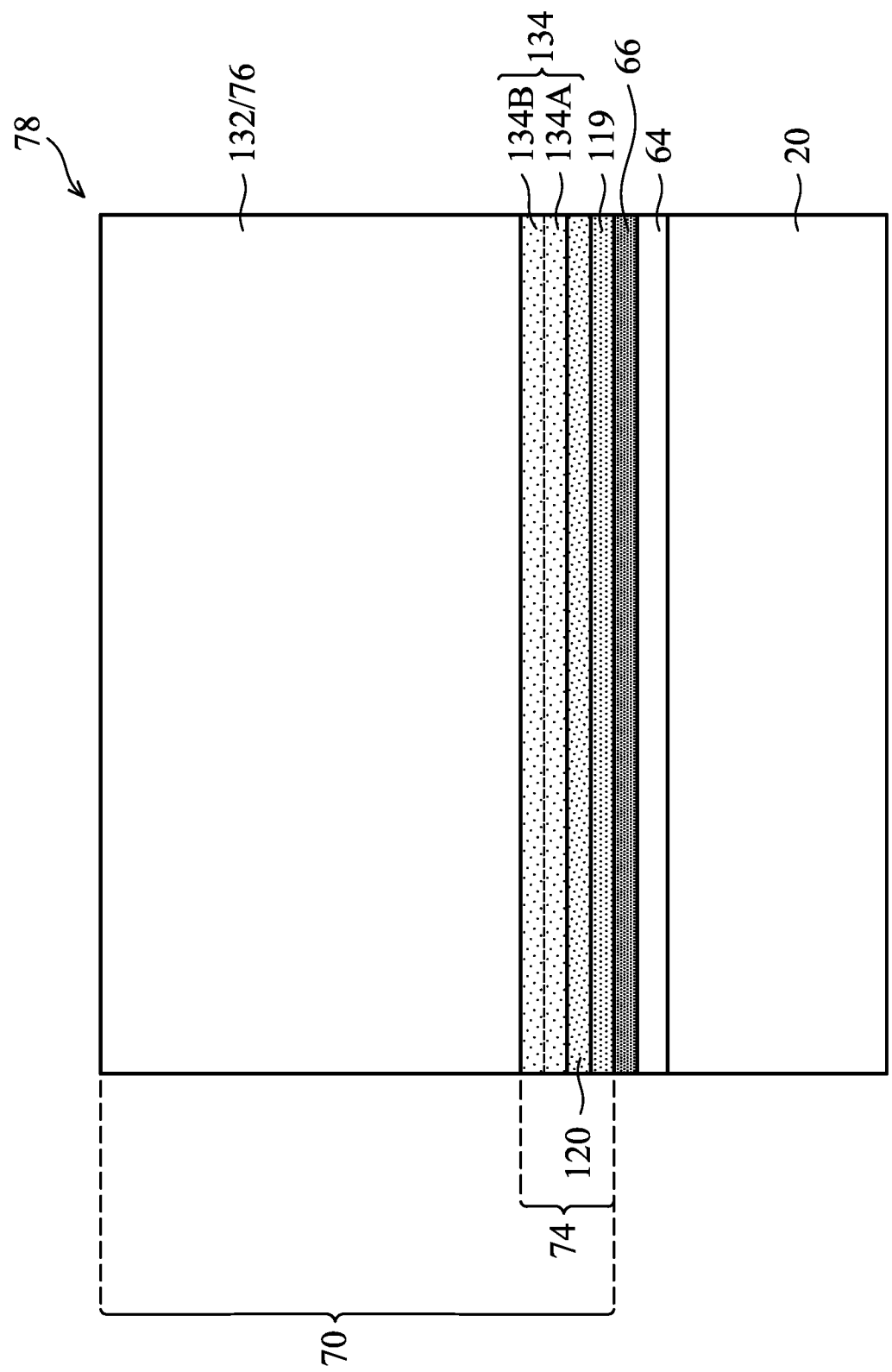

FIG. 18 illustrates the formation of a gate stack in accordance with alternative embodiments. In accordance with some embodiments, a TSN layer 134 is formed over, and possibly contacting, work-function layer 120. In accordance with some embodiments, TSN layer 134 is formed by performing one or a plurality of cycles, with each of the cycles including forming a TiN layer through ALD cycle(s) followed by forming a SiN layer through ALD cycle(s). The TiN layer and the SiN layer are schematically illustrated as 134A and 134B, respectively, to schematically illustrate how the resulting TSN layer is formed. It is appreciated, however, that the TiN layer and the SiN are actually mixed together, and cannot be distinguished from each other due to their small thickness, and may not be distinguished from each other. There may be a plurality of alternating TiN layers and SiN layers, which are sometimes difficult to distinguish from each other due to inter-diffusion, and hence are in combination referred to as TSN layer 134. Filling-metal region 132 is over and contacting TSN layer 134. In accordance with these embodiments, the silicon in TSN layer 134 has the function of blocking oxygen from diffusing downwardly, the metal in work-function layer 120 from diffusing upwardly, and fluorine (introduced during the formation of filling-metal region 132) from diffusing downwardly into the work-function layer 120.

Figure 19:
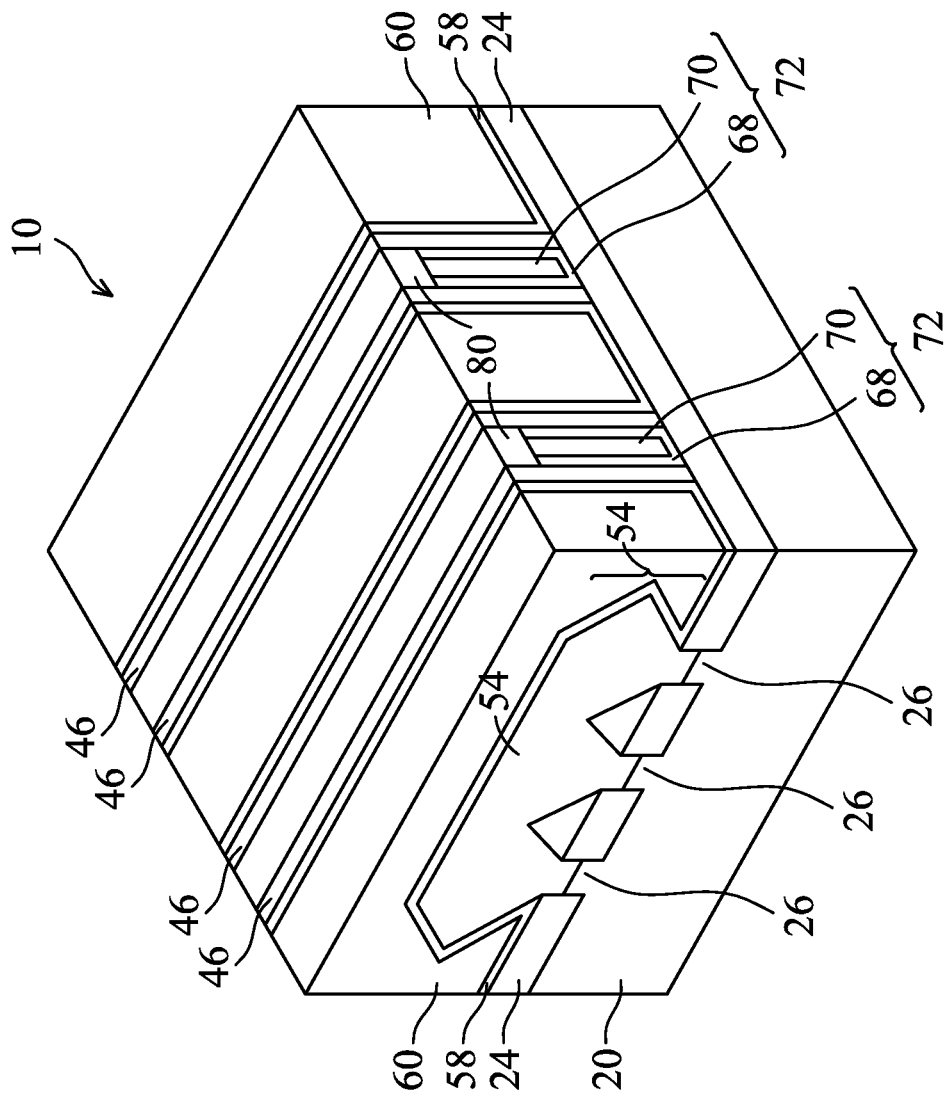

FIG. 19 illustrates the formation of hard masks 80 in accordance with some embodiments. The respective process is illustrated as process 220 in the process flow 200 shown in FIG. 23. The formation of hard masks 80 may include performing an etching process to recess gate stacks 72, so that recesses are formed between gate spacers 46, filling the recesses with a dielectric material, and then performing a planarization process such as a CMP process or a mechanical grinding process to remove excess portions of the dielectric material. Hard masks 80 may be formed of silicon nitride, silicon oxynitride, silicon oxy-carbo-nitride, or the like.

Figure 20:
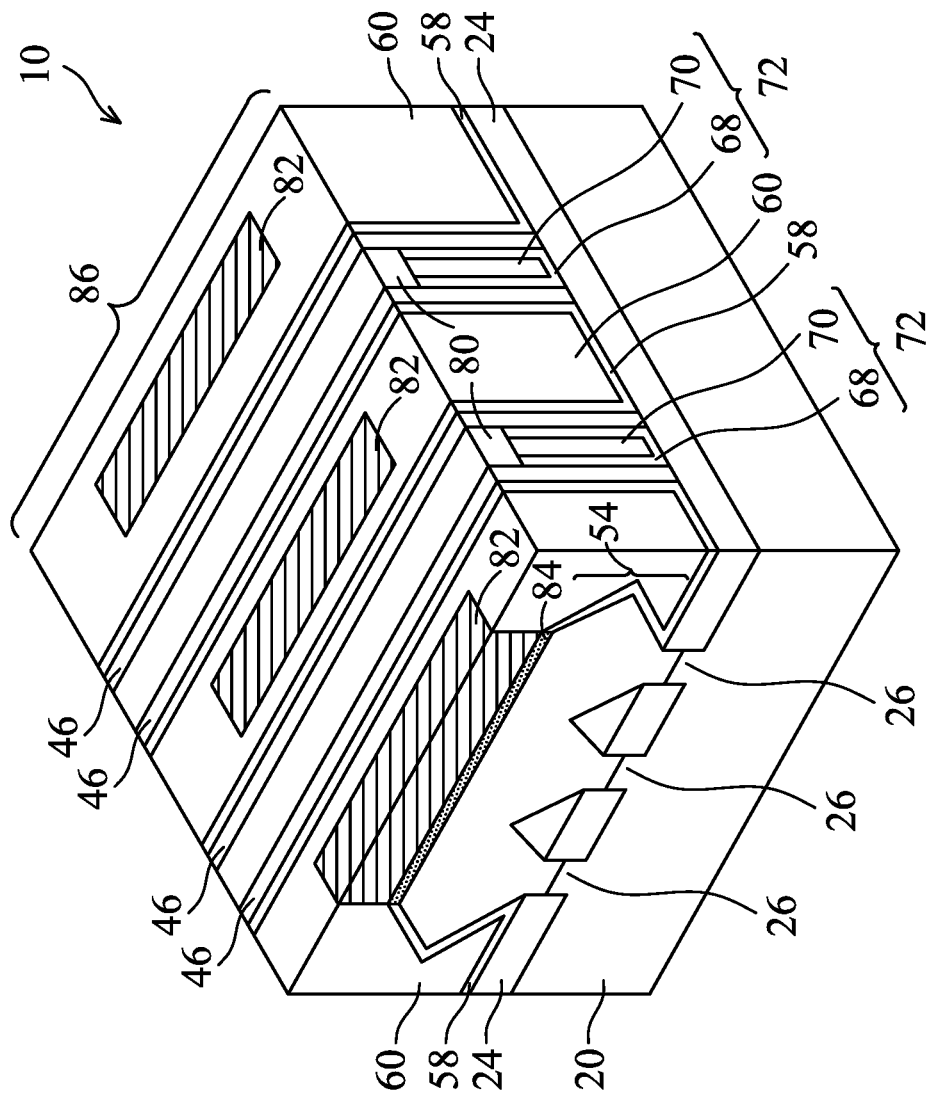

FIG. 20 illustrates the formation of source/drain contact plugs 82. The respective process is illustrated as process 222 in the process flow 200 shown in FIG. 23. The formation of source/drain contact plugs 82 include etching ILD 60 to expose the underlying portions of CESL 58, and then etching the exposed portions of CESL 58 to reveal source/drain regions 54. In a subsequent process, a metal layer (such as a Ti layer) is deposited and extending into the contact openings. A metal nitride capping layer may be performed. An anneal process is then formed to react the metal layer with the top portion of source/drain regions 54 to form silicide regions 84, as shown in FIG. 20. Next, either the previously formed metal nitride layer is left without being removed, or the previously formed metal nitride layer is removed, followed by the deposition of a new metal nitride layer (such as a titanium nitride layer). A filling-metallic material such as tungsten, cobalt, or the like, is then filled into the contact openings, followed by a planarization to remove excess materials, resulting in source/drain contact plugs 82. Gate contact plugs (not shown) are also formed to penetrate through a portion of each of hard masks 80 to contact gate electrodes 70. FinFETs 86, which may be connected in parallel as one FinFET, is thus formed.

Figure 21:
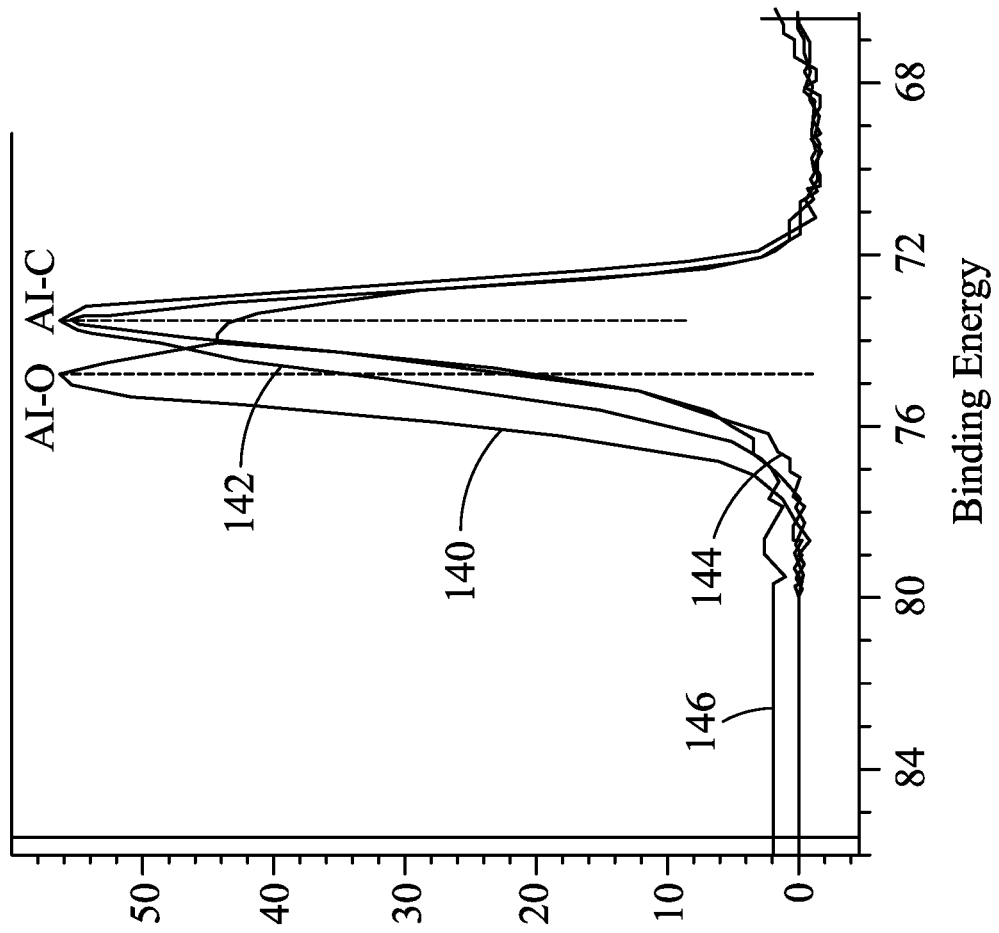
FIGS. 21 and 22 illustrate the experiment results in accordance with some embodiments.
Figure 22:
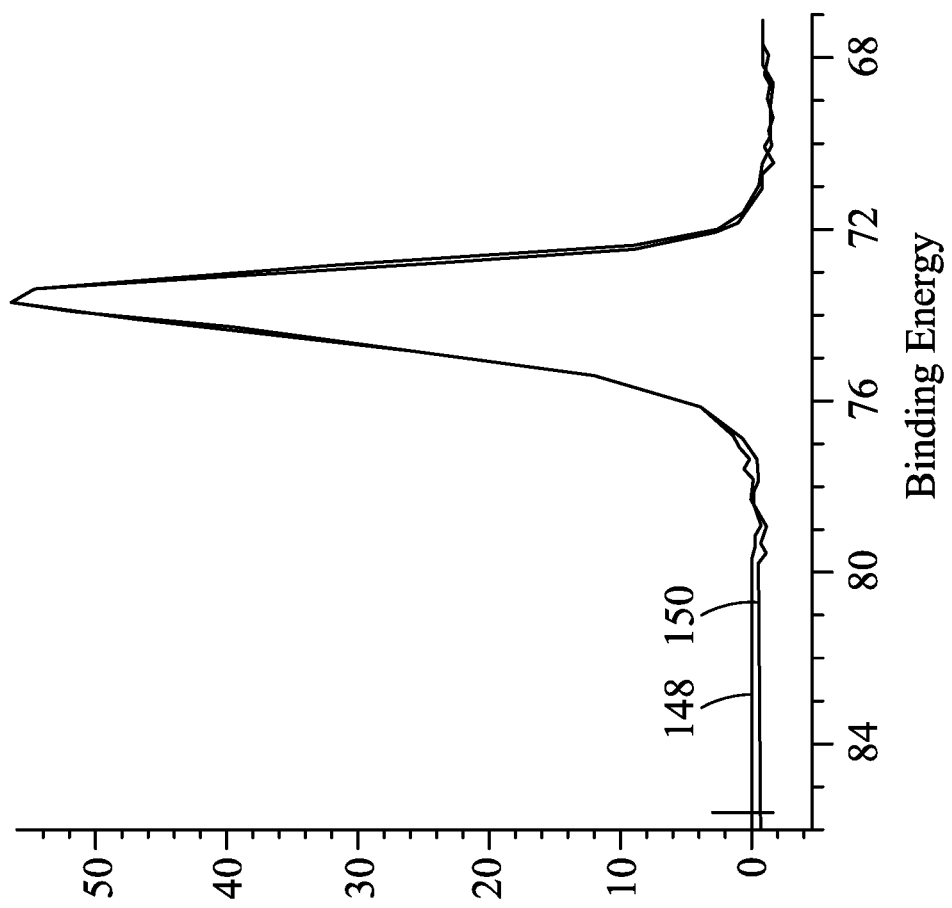

FIGS. 21 through 22 illustrate the experiment results showing the effect of the composite blocking layer in accordance with the embodiments of the present disclosure. The X-axes represent the binding energies. The Y-axes represent the signal strength values at different binding energies. FIG. 21 illustrates the binding energies of aluminum, with the characteristic binding energies of Al—O and Al—C illustrated. Lines 140, 142, 144, and 146 are obtained when a capping layer formed of a thin TSN layer, a 10 Å TiN layer, a 19 Å TiN layer, and a 37 Å TiN layer, respectively. The results indicate that line 140 has strong Al—O signal, indicating that oxygen penetrates through the thin TSN layer to form bonds with the aluminum in the work-function layer (having TiAl). There is a noticeable Al—C signal, indicating that the thin TSN layer has effect in blocking oxygen, while the blocking ability is not adequate. For line 142, the Al—O signal is weaker, and the Al—C signal is stronger. Lines 144 and 146 have even weaker Al—O signal and stronger Al—C signal. These indicate that with the increase in the thicknesses of the TiN capping layers, less Al—O is formed due to less oxygen penetration, and more Al—C remain. The results reveal that with the increase in the thicknesses of the TiN capping layers, the capping layers have improved ability to prevent oxygen from penetrating through them to reach the work-function layer.

FIG. 22 illustrates the binding energies of aluminum, with lines 148 and 150 obtained from a 19 Å TiN capping layer and a composite capping layer, respectively. The composite capping layer includes a thin TiN layer, which undergoes silicon containing gas soaking. Lines 148 and 150 substantially overlap with each other, with substantially no Al—O signal detected. This indicates that the composite layer with the $SiH_4$ soaking is as effective in blocking oxygen as the 19 Å TiN capping layer.

The embodiments of the present disclosure have some advantageous features. Through the silicon-containing gas soaking, a silicon-containing layer is formed over the work-function layer. The silicon-containing layer may be a silicon oxide layer. The silicon-containing layer is effective in preventing oxygen from penetrating downwardly to reach the work-function layer, and hence may prevent the oxidation of the work-function layer. Furthermore, the silicon-containing layer may prevent the metal in the work-function layer from diffusing upwardly, hence may help keep the composition of the work-function layer to be stable, and preventing the drift in the threshold voltage of the resulting FinFET.

In accordance with some embodiments of the present disclosure, a method of forming a semiconductor device includes forming a gate electrode in a wafer. The formation of the gate electrode comprises depositing a work-function layer; after the work-function layer is deposited, performing a first treatment on the wafer, wherein the first treatment is performed by soaking the wafer using a silicon-containing gas; after the first treatment, forming a first metal capping layer over the work-function layer; and depositing a filling metal over the first metal capping layer. In an embodiment, the first treatment is performed using a silicon-containing gas. In an embodiment, when the first treatment is performed, the work-function layer is exposed to the silicon-containing gas. In an embodiment, the method further comprises, before the first treatment, performing a second treatment on the wafer, wherein the second treatment is performed using $TiCl_4$, with the work-function layer exposed to the $TiCl_4$. In an embodiment, the method further comprises, after the first treatment and before the filling metal is deposited, exposing a respective layer that is treated by the first treatment to air through a vacuum break. In an embodiment, the method further comprises, after the first treatment, depositing a second metal capping layer, wherein the first metal capping layer is over the second metal capping layer. In an embodiment, the method further comprises a vacuum break to expose the second metal capping layer to air. In an embodiment, in the first treatment, silicon-containing molecules in the silicon-containing gas are attached to the second metal capping layer, and during the vacuum break, the silicon-containing molecules are oxidized to form a silicon oxide layer. In an embodiment, the forming the first metal capping layer comprises depositing a TiN layer. In an embodiment, the method further comprises, before the forming the gate electrode, removing a dummy gate stack, wherein the gate electrode is formed to extend into a trench left by the removed dummy gate stack, and the forming the gate electrode comprises performing a planarization process to remove portions of the work-function layer, the first metal capping layer, and the filling metal outside of the trench.

In accordance with some embodiments of the present disclosure, a method of forming a semiconductor device includes forming a semiconductor fin protruding higher than isolation regions on opposite side of the semiconductor fin; forming a dummy gate stack on a portion of the semiconductor fin; forming a source/drain region based on the semiconductor fin, wherein the source/drain region is on a side of the dummy gate stack; depositing an inter-layer dielectric to cover the source/drain region; removing the dummy gate stack to leave a trench in the inter-layer dielectric; forming a gate dielectric layer extending into the trench; depositing a work-function layer over the gate dielectric layer; forming a first metal capping layer over the work-function layer; performing a treatment on the first metal capping layer, wherein the treatment is performed by using a silicon-containing gas to soak the first metal capping layer, wherein silicon-containing molecules in the silicon-containing gas are attached to the first metal capping layer; after the treatment, forming a second metal capping layer over the work-function layer; and performing a vacuum break to expose the second metal capping layer to air. In an embodiment, the treatment is performed at a temperature in a range between about 400° C. and about 500° C. In an embodiment, the forming the first metal capping layer comprises depositing a TiN layer. In an embodiment, the treatment is performed without generating plasma from the silicon-containing gas. In an embodiment, the method further comprises depositing a filling metal over and contacting the second metal capping layer; and performing a planarization process to remove portions of the work-function layer, the first metal capping layer, the second metal capping layer, and the filling metal outside of the trench.

In accordance with some embodiments of the present disclosure, a semiconductor device includes a semiconductor region; and a gate tack on the semiconductor region. The gate stack comprises a gate dielectric; a work-function layer over the gate dielectric; a silicon-containing layer over the work-function layer; a first metal capping layer over the silicon-containing layer; and a filling metal over the first metal capping layer. In an embodiment, both the work-function layer and the first metal capping layer are free from silicon. In an embodiment, the silicon-containing layer comprises silicon oxide. In an embodiment, the semiconductor device further comprises a second metal capping layer over and contacting the work-function layer, wherein the silicon-containing layer is over and contacting the second metal capping layer. In an embodiment, the silicon-containing layer further comprises chlorine.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate electrode in a wafer comprising:
        depositing a first metal capping layer over a semiconductor region;
        performing a first treatment process on the first metal capping layer using a chlorine-containing precursor;
        performing a second treatment process on the first metal capping layer that has been treated by the first treatment process to form a silicon-containing layer, wherein the second treatment process is performed using a silicon-containing gas, and wherein the first metal capping layer and the second treatment process are performed without vacuum break in between;
        after the second treatment process for forming the silicon-containing layer, performing a vacuum break process to oxidize the silicon-containing layer and to convert the silicon-containing layer into a silicon oxide layer, wherein at a time the vacuum break process is performed, the silicon-containing layer is a topmost layer of the wafer;
        after the vacuum break process, depositing a second metal capping layer over the silicon oxide layer; and
        depositing a filling metal over the first metal capping layer.

2. The method of claim 1 further comprising depositing a work-function layer over the semiconductor region, wherein the first metal capping layer is deposited over the work-function layer to form an interface in between.

3. The method of claim 1 being free from an oxidation process between the first treatment process and the second treatment process.

4. The method of claim 1, wherein the depositing the first metal capping layer is performed using $TiCl_4$ as a precursor.

5. The method of claim 1, wherein the second treatment process comprises a thermal soaking process using a silicon-containing process gas.

6. The method of claim 1 further comprising:
    performing a third treatment process on the second metal capping layer using an additional silicon-containing gas; and
    after the third treatment process, performing a vacuum break to expose the second metal capping layer to air.

7. The method of claim 1, wherein the second treatment process is performed using silane or disilane.

8. The method of claim 1, wherein the first metal capping layer comprises TiN.

9. The method of claim 1, wherein the first metal capping layer comprises TaN.

10. A method comprising:
forming a p-type source/drain region on a side of a dummy gate stack;
removing the dummy gate stack to leave a trench between two gate spacers;
forming a gate dielectric layer extending into the trench;
depositing a work-function layer over the gate dielectric layer;
depositing a first metal capping layer over the work-function layer;
performing a treatment process on the first metal capping layer using a silicon-containing gas, with a silicon-containing layer being formed on the first metal capping layer;
performing a vacuum break to introduce oxygen to the silicon-containing layer and to convert the silicon-containing layer into a silicon oxide layer, wherein at a time the vacuum break is performed, the silicon-containing layer is a topmost layer of a respective wafer that comprises the silicon-containing layer; and
after the vacuum break, depositing a second metal capping layer over the silicon oxide layer.

11. The method of claim 10, wherein the first metal capping layer and the second metal capping layer are formed of a same material.

12. The method of claim 11, wherein the depositing the first metal capping layer and the depositing the second metal capping layer comprise depositing titanium nitride.

13. A method comprising:
depositing a first metal capping layer on a work-function layer;
performing a silicon-containing gas soaking process on the first metal capping layer to form a silicon-containing layer, wherein the depositing the first metal capping layer and the silicon-containing gas soaking process are performed in a same vacuum environment;
after the silicon-containing layer is formed, introducing oxygen ($O_2$) to the silicon-containing layer through a vacuum break process to form a silicon-oxide-containing layer, wherein the silicon-containing layer is converted into an oxide layer, and wherein at a time the vacuum break process is performed, the silicon-containing layer is a topmost layer of a respective wafer that comprises the silicon-containing layer;
depositing a second metal capping layer over the oxide layer, wherein the first metal capping layer and the second metal capping layer are formed of a same material; and
forming a filling-metal region over the second metal capping layer.

14. The method of claim 13, wherein the second metal capping layer is deposited over and contacting the silicon-oxide-containing layer.

15. The method of claim 13, wherein the second metal capping layer is deposited over and contacting the silicon-containing layer, and wherein the first metal capping layer and the second metal capping layer are formed of a same material.

16. The method of claim 13, wherein the introducing the oxygen is performed when the second metal capping layer is exposed.

17. The method of claim 13, wherein the introducing the oxygen is performed through a vacuum break.

18. The method of claim 10, wherein the first metal capping layer comprises TaN.

19. The method of claim 13, wherein the first metal capping layer comprises TiN.

20. The method of claim 13, wherein the first metal capping layer comprises TaN.

* * * * *